United States Patent
Trezza

(10) Patent No.: US 7,831,151 B2
(45) Date of Patent: Nov. 9, 2010

(54) REDUNDANT OPTICAL DEVICE ARRAY

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 1798 days.

(21) Appl. No.: 09/896,797

(22) Filed: Jun. 29, 2001

(65) Prior Publication Data

US 2003/0011851 A1    Jan. 16, 2003

(51) Int. Cl.
*H04B 10/00* (2006.01)
(52) U.S. Cl. .................. 398/135; 398/164; 398/138
(58) Field of Classification Search ............... 398/1–8, 398/135–139, 118–131
See application file for complete search history.

(56) References Cited

U.S. PATENT DOCUMENTS

| | | | |
|---|---|---|---|
| 3,825,318 A | | 7/1974 | Croset et al. |
| 4,202,007 A | | 5/1980 | Dougherty et al. |
| 4,230,385 A | | 10/1980 | Ammon et al. |
| 4,341,438 A | * | 7/1982 | Seki et al. .................. 385/16 |
| 4,403,139 A | * | 9/1983 | De Loach, Jr. ............ 250/205 |
| 4,481,403 A | | 11/1984 | Del Monte |
| 4,533,833 A | | 8/1985 | Copeland et al. |
| 4,659,920 A | * | 4/1987 | Nishiura et al. ......... 250/214 R |
| 4,661,713 A | * | 4/1987 | Besson et al. ............ 250/208.3 |
| 4,719,498 A | | 1/1988 | Wada et al. |
| 4,741,595 A | | 5/1988 | Onoda et al. |
| 4,744,627 A | | 5/1988 | Chande et al. |
| 4,815,805 A | | 3/1989 | Levinson et al. |
| 4,842,360 A | | 6/1989 | Caro et al. |
| 4,920,542 A | * | 4/1990 | Brosson et al. .......... 372/50.12 |
| 4,934,785 A | | 6/1990 | Mathis et al. |
| 4,966,432 A | | 10/1990 | Okada et al. |
| 4,990,803 A | | 2/1991 | Gilbert |
| 5,091,018 A | | 2/1992 | Fraas et al. |
| 5,100,480 A | | 3/1992 | Hayafuji |
| 5,135,590 A | | 8/1992 | Basavanhally et al. |
| 5,136,152 A | | 8/1992 | Lee |

(Continued)

FOREIGN PATENT DOCUMENTS

DE        3634187        4/1988

(Continued)

OTHER PUBLICATIONS

Decision of Rejection issued in Korean Patent Application No. 7027298/2008 and transmitted on Dec. 15, 2009. (English translation provided).

(Continued)

*Primary Examiner*—Agustin Bello

(57) ABSTRACT

An optical module has multiple optical devices. At least two of the multiple optical devices are a group. Each of the optical devices in the group are individually selectable relative to the others. The optical module also has a controller, coupled to the devices such that the controller can select which of the devices in the group will be active at a given time. A communications network has a first transmitter having a number of usable channels, a first receiver, and optical fibers connecting the first transmitter to the first receiver. The first transmitter has multiple lasers, at least some being selectable as either active or backup lasers. The multiple lasers are controllable such that, if a specific channel is in use by an active laser and a laser failure occurs for that channel, a redundant laser can be substituted for the active laser and, after the substitution, the specific channel can be used using the redundant laser.

51 Claims, 13 Drawing Sheets

U.S. PATENT DOCUMENTS

| | | |
|---|---|---|
| 5,149,958 A | 9/1992 | Hallenbeck et al. |
| 5,175,928 A | 1/1993 | Grabbe |
| 5,185,846 A | 2/1993 | Basavanhally et al. |
| 5,212,707 A | 5/1993 | Heidel et al. |
| 5,214,730 A | 5/1993 | Nagasawa et al. |
| 5,241,610 A * | 8/1993 | Labiche et al. ............... 385/16 |
| 5,241,612 A | 8/1993 | Iwama |
| 5,243,681 A | 9/1993 | Bowen et al. |
| 5,259,052 A | 11/1993 | Briggs et al. |
| 5,266,794 A | 11/1993 | Olbright et al. |
| 5,268,786 A | 12/1993 | Matsushita et al. |
| 5,269,453 A | 12/1993 | Melton et al. |
| 5,299,222 A | 3/1994 | Shannon |
| 5,319,655 A | 6/1994 | Thornton |
| 5,337,384 A | 8/1994 | Basavanhally et al. |
| 5,359,208 A | 10/1994 | Katsuki et al. |
| 5,377,286 A | 12/1994 | Iida et al. |
| 5,379,361 A | 1/1995 | Maekawa et al. |
| 5,385,632 A | 1/1995 | Goossen |
| 5,394,495 A | 2/1995 | Booth et al. |
| 5,394,498 A | 2/1995 | Hinterlong et al. |
| 5,400,429 A | 3/1995 | Ames et al. |
| 5,408,319 A | 4/1995 | Halbout et al. |
| 5,416,624 A | 5/1995 | Karstensen |
| 5,416,868 A | 5/1995 | Kakii et al. |
| 5,434,939 A | 7/1995 | Matsuda |
| 5,446,815 A | 8/1995 | Ota et al. |
| 5,470,787 A | 11/1995 | Greer |
| 5,472,914 A | 12/1995 | Martin et al. |
| 5,473,716 A | 12/1995 | Lebby et al. |
| 5,475,701 A | 12/1995 | Hibbs-Brenner |
| 5,477,933 A | 12/1995 | Nguyen |
| 5,479,288 A | 12/1995 | Ishizuka et al. |
| 5,485,480 A | 1/1996 | Kleinerman |
| 5,488,504 A | 1/1996 | Worchesky et al. |
| 5,491,712 A | 2/1996 | Lin et al. |
| 5,499,313 A | 3/1996 | Kleinerman |
| 5,500,540 A * | 3/1996 | Jewell et al. ............... 257/82 |
| 5,501,893 A | 3/1996 | Laermer et al. |
| 5,511,085 A | 4/1996 | Marshall |
| 5,521,734 A | 5/1996 | Frigo |
| 5,523,628 A | 6/1996 | Williams et al. |
| 5,548,675 A | 8/1996 | Shigematsu et al. |
| 5,550,942 A | 8/1996 | Sheem |
| 5,568,574 A | 10/1996 | Tanguay et al. |
| 5,577,064 A | 11/1996 | Swirhun et al. |
| 5,579,426 A | 11/1996 | Li et al. |
| 5,598,965 A | 2/1997 | Scheu |
| 5,602,863 A | 2/1997 | Itagaki |
| 5,608,264 A | 3/1997 | Gaul |
| 5,610,547 A | 3/1997 | Koyama et al. |
| 5,612,968 A * | 3/1997 | Zah ............... 372/50.12 |
| 5,613,024 A | 3/1997 | Shahid |
| 5,617,492 A | 4/1997 | Beach et al. |
| 5,633,967 A | 5/1997 | Haruta |
| 5,635,014 A | 6/1997 | Taylor |
| 5,636,052 A | 6/1997 | Arney et al. |
| 5,637,885 A | 6/1997 | Heinemann et al. |
| 5,664,039 A | 9/1997 | Grinderslev et al. |
| 5,671,311 A | 9/1997 | Stillie et al. |
| 5,674,778 A | 10/1997 | Lee et al. |
| 5,708,569 A | 1/1998 | Howard et al. |
| 5,715,270 A | 2/1998 | Zediker et al. |
| 5,729,038 A | 3/1998 | Young et al. |
| 5,743,785 A | 4/1998 | Lundberg et al. |
| 5,751,757 A | 5/1998 | Jiang et al. |
| 5,761,350 A | 6/1998 | Koh |
| 5,764,392 A | 6/1998 | Van As et al. |
| 5,764,405 A * | 6/1998 | Alphonsus ............... 359/341.33 |
| 5,777,761 A * | 7/1998 | Fee ............... 398/7 |
| 5,793,789 A | 8/1998 | Ben-Michael et al. |
| 5,814,889 A | 9/1998 | Gaul |
| 5,815,621 A | 9/1998 | Sakai et al. |
| 5,843,799 A * | 12/1998 | Hsu et al. ............... 438/6 |
| 5,853,626 A | 12/1998 | Kato |
| 5,861,968 A | 1/1999 | Kerklaan et al. |
| 5,877,519 A | 3/1999 | Jewell |
| 5,886,581 A | 3/1999 | Hugel et al. |
| 5,909,294 A * | 6/1999 | Doerr et al. ............... 398/138 |
| 5,912,913 A * | 6/1999 | Kondow et al. ............... 372/45.01 |
| 5,912,997 A | 6/1999 | Bischel et al. |
| 5,914,976 A | 6/1999 | Jayaraman et al. |
| 5,946,130 A | 8/1999 | Rice |
| 5,946,545 A | 8/1999 | Bertin et al. |
| 5,962,846 A * | 10/1999 | Goossen ............... 250/214.1 |
| 5,963,793 A | 10/1999 | Rinne |
| 5,978,401 A | 11/1999 | Morgan |
| 5,991,479 A | 11/1999 | Kleinerman |
| 5,994,927 A | 11/1999 | Naito et al. |
| 6,005,262 A | 12/1999 | Cunningham et al. |
| 6,012,856 A | 1/2000 | Kim et al. |
| 6,016,067 A | 1/2000 | Vulih et al. |
| 6,018,604 A | 1/2000 | Ja |
| 6,021,149 A | 2/2000 | Miyazaki et al. |
| 6,022,760 A | 2/2000 | Lebby et al. |
| 6,023,361 A | 2/2000 | Ford et al. |
| 6,037,832 A | 3/2000 | Kaminishi |
| 6,046,659 A | 4/2000 | Loo et al. |
| 6,048,751 A | 4/2000 | D'Asaro et al. |
| 6,049,641 A * | 4/2000 | Deacon et al. ............... 385/15 |
| 6,062,740 A | 5/2000 | Ohtsuka et al. |
| 6,075,710 A | 6/2000 | Lau |
| 6,084,848 A | 7/2000 | Goto |
| 6,097,748 A | 8/2000 | Huang et al. |
| 6,118,908 A | 9/2000 | Bischel et al. |
| 6,136,623 A * | 10/2000 | Hofstetter et al. ............... 438/28 |
| 6,137,930 A | 10/2000 | Laughlin |
| 6,153,927 A | 11/2000 | Raj et al. |
| 6,158,900 A | 12/2000 | Omiya et al. |
| 6,160,450 A | 12/2000 | Eschauzier et al. |
| 6,167,075 A | 12/2000 | Craig et al. |
| 6,172,417 B1 | 1/2001 | Goossen |
| 6,174,424 B1 | 1/2001 | Wach et al. |
| 6,184,066 B1 * | 2/2001 | Chino et al. ............... 438/118 |
| 6,188,118 B1 | 2/2001 | Severn |
| 6,214,643 B1 | 4/2001 | Chiu |
| 6,215,114 B1 | 4/2001 | Yagi et al. |
| 6,224,780 B1 | 5/2001 | Silverbrook |
| 6,235,354 B1 | 5/2001 | Lee et al. |
| 6,238,100 B1 | 5/2001 | Sasaki et al. |
| 6,246,813 B1 | 6/2001 | Zheng |
| 6,253,986 B1 | 7/2001 | Brofman |
| 6,283,359 B1 | 9/2001 | Brofman |
| 6,292,529 B1 | 9/2001 | Marcovici et al. |
| 6,296,779 B1 | 10/2001 | Clark et al. |
| 6,317,235 B1 | 11/2001 | Hamilton |
| 6,318,909 B1 | 11/2001 | Giboney et al. |
| 6,324,316 B1 | 11/2001 | Fouquet et al. |
| 6,324,318 B1 * | 11/2001 | Suzuki ............... 385/24 |
| 6,325,553 B1 * | 12/2001 | Deacon et al. ............... 385/89 |
| 6,328,482 B1 | 12/2001 | Jian |
| 6,340,113 B1 | 1/2002 | Avery et al. |
| 6,343,171 B1 | 1/2002 | Yoshimura et al. |
| 6,379,053 B1 | 4/2002 | van Doorn |
| 6,404,542 B1 | 6/2002 | Ziari et al. |
| 6,406,942 B2 | 6/2002 | Honda |
| 6,419,404 B1 * | 7/2002 | Deri et al. ............... 385/89 |
| 6,423,561 B1 * | 7/2002 | Chino et al. ............... 438/29 |
| 6,438,150 B1 | 8/2002 | Yoo |
| 6,440,767 B1 | 8/2002 | Loo et al. |
| 6,442,306 B1 | 8/2002 | Dautartas et al. |
| 6,451,626 B1 | 9/2002 | Lin |
| 6,470,123 B1 | 10/2002 | Sherman et al. |
| 6,479,844 B2 | 11/2002 | Taylor |

| | | |
|---|---|---|
| 6,483,862 B1 | 11/2002 | Aronson et al. |
| 6,485,993 B2 | 11/2002 | Trezza et al. |
| 6,496,624 B1 | 12/2002 | Hikita et al. |
| 6,498,089 B2 | 12/2002 | Komada |
| 6,504,975 B1 | 1/2003 | Yamagata et al. |
| 6,509,992 B1 * | 1/2003 | Goodwill ............ 398/131 |
| 6,522,794 B1 | 2/2003 | Bischel et al. |
| 6,528,891 B2 | 3/2003 | Lin |
| 6,530,700 B2 * | 3/2003 | Williams ............ 385/92 |
| 6,532,101 B2 | 3/2003 | Islam et al. |
| 6,544,371 B2 | 4/2003 | Senoo |
| 6,553,044 B1 | 4/2003 | Eden |
| 6,558,976 B2 | 5/2003 | Shrauger |
| 6,586,090 B2 | 7/2003 | Nakagawa et al. |
| 6,614,949 B2 * | 9/2003 | Williams et al. ............ 385/14 |
| 6,633,719 B2 | 10/2003 | Basavanhally et al. |
| 6,635,960 B2 | 10/2003 | Farrar |
| 6,642,072 B2 | 11/2003 | Inoue et al. |
| 6,647,182 B2 * | 11/2003 | Sappey et al. ............ 385/37 |
| 6,666,590 B2 | 12/2003 | Brosnan |
| 6,686,654 B2 | 2/2004 | Farrar |
| 6,693,926 B2 * | 2/2004 | Cayrefourcq et al. ......... 372/14 |
| 6,695,493 B2 * | 2/2004 | Ciemiewcz ............ 385/89 |
| 6,719,927 B2 | 4/2004 | Sakurai et al. |
| 6,731,853 B2 | 5/2004 | Boudreau et al. |
| 6,751,379 B2 | 6/2004 | Capewell et al. |
| 6,763,157 B1 * | 7/2004 | Williams et al. ............ 385/15 |
| 6,768,403 B2 | 7/2004 | Hsu et al. |
| 6,774,017 B2 | 8/2004 | Brown |
| 6,775,308 B2 * | 8/2004 | Hamster et al. ............ 372/28 |
| 6,775,480 B1 * | 8/2004 | Goodwill ............ 398/158 |
| 6,780,280 B2 | 8/2004 | Halterbeck et al. |
| 6,785,447 B2 | 8/2004 | Yoshimura et al. |
| 6,816,529 B2 * | 11/2004 | Vail et al. ............ 372/50.1 |
| 6,868,198 B2 * | 3/2005 | Sunaga et al. ............ 385/18 |
| 6,888,170 B2 | 5/2005 | Schaff et al. |
| 6,967,307 B2 | 11/2005 | Hembree et al. |
| 6,993,258 B2 | 1/2006 | Payne et al. |
| 7,012,943 B2 | 3/2006 | Tran et al. |
| 7,042,643 B2 | 5/2006 | Miles |
| 7,045,824 B2 * | 5/2006 | Malone et al. ............ 257/82 |
| 7,079,776 B1 * | 7/2006 | Shimoda et al. ............ 398/140 |
| 7,106,973 B2 * | 9/2006 | Kube et al. ............ 398/164 |
| 7,107,666 B2 | 9/2006 | Hiatt et al. |
| 7,157,372 B1 | 1/2007 | Trezza |
| 7,170,183 B1 | 1/2007 | Kim et al. |
| 7,227,213 B2 | 6/2007 | Mastromatteo et al. |
| 7,242,099 B2 | 7/2007 | Lin |
| 7,245,647 B2 | 7/2007 | Jikutani |
| 7,276,787 B2 | 10/2007 | Edelstein et al. |
| 7,294,531 B2 | 11/2007 | Hwang et al. |
| 7,300,865 B2 | 11/2007 | Hsieh et al. |
| 7,371,676 B2 | 5/2008 | Hembree |
| 7,466,882 B2 | 12/2008 | Welch et al. |
| 7,483,599 B2 | 1/2009 | Dominic et al. |
| 7,495,316 B2 | 2/2009 | Kirby |
| 2001/0020739 A1 | 9/2001 | Honda |
| 2001/0030782 A1 | 10/2001 | Trezza |
| 2001/0038103 A1 | 11/2001 | Nitta et al. |
| 2001/0051026 A1 | 12/2001 | Steinberg et al. |
| 2002/0051268 A1 | 5/2002 | Tonehira et al. |
| 2002/0076168 A1 | 6/2002 | Suematsu et al. |
| 2002/0081773 A1 | 6/2002 | Inoue et al. |
| 2002/0090749 A1 | 7/2002 | Simmons |
| 2002/0141011 A1 | 10/2002 | Green et al. |
| 2002/0154355 A1 | 10/2002 | Payne et al. |
| 2002/0167050 A1 * | 11/2002 | Brown et al. ............ 257/347 |
| 2002/0168139 A1 | 11/2002 | Clarkson et al. |
| 2003/0043582 A1 * | 3/2003 | Chan et al. ............ 362/259 |
| 2003/0235415 A1 * | 12/2003 | Peters et al. ............ 398/197 |
| 2004/0029304 A1 | 2/2004 | Naydenkov et al. |
| 2004/0091011 A1 * | 5/2004 | Liu ............ 372/46 |
| 2005/0094926 A1 | 5/2005 | Dominic et al. |
| 2005/0100345 A1 * | 5/2005 | Welch et al. ............ 398/183 |
| 2005/0230804 A1 | 10/2005 | Tanida et al. |
| 2006/0128061 A1 | 6/2006 | Ravi et al. |
| 2006/0162104 A1 * | 7/2006 | Malone et al. ............ 15/97.1 |
| 2006/0278988 A1 | 12/2006 | Trezza |
| 2006/0289990 A1 | 12/2006 | Farrar |
| 2007/0096263 A1 | 5/2007 | Furukawa et al. |
| 2007/0278641 A1 | 12/2007 | Trezza |
| 2008/0029851 A1 | 2/2008 | Kirby et al. |

FOREIGN PATENT DOCUMENTS

| | | |
|---|---|---|
| DE | 42 41 453 | 6/1994 |
| DE | 19838430 | 3/2000 |
| EP | 0 452 588 | 10/1991 |
| EP | 0 684 643 | 11/1995 |
| EP | 0 762 677 A2 | 3/1997 |
| EP | 0760544 | 3/1997 |
| EP | 0 768 546 | 4/1997 |
| EP | 0 810 659 | 12/1997 |
| EP | 0 889 338 | 1/1999 |
| EP | 0 907 206 | 4/1999 |
| EP | 0 922 582 | 6/1999 |
| EP | 0987800 | 3/2000 |
| EP | 1022 869 A1 | 7/2000 |
| EP | 1 065 059 | 1/2001 |
| GB | 2 062 891 | 5/1981 |
| JP | 04-003029 | 1/1992 |
| JP | 04-039609 | 2/1992 |
| JP | 04-107974 | 4/1992 |
| JP | 07-335855 | 12/1995 |
| JP | 08-111559 | 4/1996 |
| JP | 08-181372 | 7/1996 |
| JP | 09 015088 | 1/1997 |
| JP | 09-015088 | 1/1997 |
| JP | 09-203822 | 8/1997 |
| JP | 11-072652 | 3/1999 |
| JP | 11-163528 | 6/1999 |
| JP | 11-307869 | 11/1999 |
| JP | 2000-307025 | 11/2000 |
| JP | 2002-162536 | 6/2002 |
| KR | 100 340 665 | 5/2002 |
| KR | 100340665 | 5/2002 |
| WO | WO 92/03848 | 3/1992 |
| WO | WO 98/57208 | 12/1998 |
| WO | WO 99/15926 | 4/1999 |
| WO | WO 01/69675 | 9/2001 |
| WO | WO 01/94995 | 12/2001 |

OTHER PUBLICATIONS

Notice of Decision for Patent issued in Korean Patent Application No. 10-2005-7001778 and dated Mar. 29, 2010 (English translation provided).
Notice of Decision for Patent issued in Korean Patent Application No. 10-2009-7011845 and dated Mar. 16, 2010 (English translation provided).
EP Communication issued in EP Patent Application No. 04 816 927.0 dated Jun. 15, 2009.
International Search Report dated Jan. 30, 2003.
Communication for EP application Serial No. 02 759 141 dated Nov. 21, 2005.
Communication for EP application Serial No. 02 763 264 dated Nov. 9, 2005.
English translation of first Office Action issued in corresponding Chinese Application No. 2004800321558 dispatched on Feb. 6, 2009.
English translation of Office Action issued in corresponding Korean Application No. 10-2003-7016814 issued Nov. 5, 2008.
International Preliminary Examination Report for PCT/US02/21950 completed Jun. 9, 2003.
International Preliminary Examination Report for PCT/US02/20830 completed Apr. 9, 2003.

International Preliminary Examination Report for PCT/US02/22053 completed May 13, 2003.
International Preliminary Examination Report for PCT/US02/22084 completed Apr. 16, 2003.
International Preliminary Examination Report for PCT/US02/22090 completed Apr. 17, 2003.
International Preliminary Examination Report for PCT/US02/22092 completed Sep. 20, 2006.
International Preliminary Examination Report for PCT/US02/22093 completed Jun. 24, 2003.
International Preliminary Examination Report for PCT/US03/06322 completed Oct. 30, 2003.
International Preliminary Examination Report for PCT/US02/22096 completed Sep. 16, 2004.
International Preliminary Report of Patentability for PCT/US2004/034603 issued Nov. 1, 2006.
International Search Report for PCT/US02/21950 completed Sep. 24, 2002.
International Search Report for PCT/US02/22052 completed Sep. 24, 2002.
International Search Report for PCT/US02/22053 completed Oct. 16, 2002.
International Search Report for PCT/US02/22084 completed Apr. 16, 2003.
International Search Report for PCT/US02/22090 completed Oct. 15, 2002.
International Search Report for PCT/US02/22092 completed Sep. 26, 2002.
International Search Report for PCT/US02/22093 completed Apr. 15, 2003.
International Search Report for PCT/US02/22096 completed Feb. 24, 2003.
International Search Report for PCT/US0220830 completed Oct. 14, 2002.
International Search Report for PCT/US03/06322 mailed Jul. 28, 2003.
International Search Report for PCT/US03/22332 mailed Mar. 22, 2004.
Written Opinion for PCT/US02/22052 mailed Oct. 10, 2006.
Written Opinion for PCT/US02/22092 mailed Jun. 19, 2006.
De Brabander et al., "Single Polarization Optical Waveguide on Silicon," IEEE Journal of Quantum Electronics, v. 27, No. 3 (Mar. 1, 1991), pp. 575-579.
Dines, "Smart Pixel Optoelectronic Receiver Based on a Charge Sensitive Amplifier Design," IEEE Journal of Selected topics in Quantum Electronics, V. 2, No. 1 (Apr. 1996), pp. 117-120.
First Office Action for Chinese application Serial No. 028130960 dispatched on Nov. 17, 2006.
First Office Action for Chinese application Serial No. 028130995 dispatched on Mar. 25, 2005.
Madhaven et al., "Low-power 2.5Gbit/s VCSEL Driver in 0.5um CMOS Technology," Electronics Letters, V. 34, No. 2 (Jan. 22, 1998), pp. 178-179.
Supplementary European Search Report for EP application Serial No. 02 76 3264 completed Jun. 16, 2005.
Supplementary Partial European Search Report and Supplementary European Search Report for EP application Serial No. 02 759 141 completed on Jun. 27, 2005.
Supplementary Partial European Search Report for EP application Serial No. 02 76 5833 completed on Jun. 27, 2005.
Van Blerkom, "Transimpedance Receiver Design Optimization for Smart Pixel Arrays," Journal of Lightwave Technology, V. 16, No. 1 (Jan. 1998), pp. 119-126.
Woodward et al., "Optical Receivers for Optoelectronic VLSI," IEEE Journal of Selected Topics in Quantum Electronics, V. 2, No. 1 (Apr. 1996), pp. 106-115.
Woodward, "Optical Receivers for Smart Pixel Applications," Photonics West Conference, Jan. 1996, pp. 67-68.
Woodward, et al., "Parallel Operation of 50 Element Two-Dimensional CMOS Smart-Pixel Receiver Array," IEEE Electronic Letters, vol. 34, No. 10, (May 14, 1998), pp. 936-937.
The First Office Action in Chinese Application No. 028130987 dispatched on Sep. 15, 2006.
The Second Office Action in Chinese Application No. 028130987 mailed on Jun. 22, 2007.
The Third Office Action in Chinese Application No. 028130987 mailed on Apr. 4, 2008.
The First Office Action for Chinese Application No. 028130901 mailed on Feb. 24, 2006.
The First Office Action for Chinese Application No. 028131851 dispatched on Sep. 1, 2006.
The Second Office Action for Chinese Application No. 028131851 dispatched on Mar. 16, 2007.
The First Office Action for Chinese Application No. 028130979 dispatched on Jul. 15, 2005.
The First Office Action for Chinese Application No. 028130898 dispatched on Aug. 12, 2005.
The Second Office Action for Chinese Application No. 028130898 dispatched on Mar. 2, 2007.
The First Office Action for Chinese Application No. 02813100.2 dispatched on Sep. 2, 2005.
The Communication for EP Application No. 02 73 9971.6 dated Mar. 15, 2006.
The Communication for EP Application No. 02 73 9971.6 dated May 20, 2005.
The Communication for EP Application No. 02 73 9971.6 dated Aug. 2, 2004.
The Supplementary European Search Report for EP Application No. 02 74 9716 completed on Feb. 13, 2007.
The Supplementary European Search Report for EP Application No. 02 74 9717 completed on Jan. 26, 2005.
The Communication for EP Application No. 02 74 9717.1 dated Mar. 24, 2005.
The Communication for EP Application No. 02 74 9717.1 dated Dec. 23, 2005.
The Supplementary European Search Report for EP Application No. 02 75 3369 completed on Jul. 7, 2005.
The Supplementary European Search Report for EP Application No. 02 79 8907 completed on Jul. 13, 2005.
The Supplementary European Search Report for EP Application No. 02 75 3370 completed on Feb. 8, 2007.
The Communication for EP Application No. 02 75 3370.2 dated May 7, 2007.
The Communication for EP Application No. 02 75 6474.9 dated Aug. 6, 2008.
The Communication for EP Application No. 02 75 6474.9 dated Mar. 10, 2005.
The Supplementary European Search Report for EP Application No. 04 81 6927.0 completed on Jan. 10, 2008.
The Communication for EP Application No. 04 81 6927.0 dated on Apr. 10, 2008.
The International Search Report and Written Opinion for PCT/US2002/020112 mailed on Dec. 13, 2002.
The International Preliminary Examination Report for PCT/US2002/020112 completed Nov. 13, 2003.
The International Search Report for PCT/US2002/020695 mailed on Oct. 18, 2002.
The Written Opinion for PCT/US2002/020695 mailed on May 1, 2003.
The International Preliminary Examination Report for PCT/US2002/020695 completed on Aug. 8, 2003.
The International Search Report for PCT/US2002/020696 mailed on Dec. 12, 2002.
The International Preliminary Examination Report for PCT/US2002/020696 completed on Mar. 4, 2003.
The International Search Report for PCT/US2002/020699 mailed on Nov. 7, 2002.
The International Preliminary Examination Report for PCT/US2002/020699 completed on Mar. 7, 2003.
The International Search Report for PCT/US2002/022051 mailed on Nov. 27, 2002.
The International Preliminary Examination Report for PCT/US2002/022051 completed on Mar. 17, 2004.
The International Search Report for PCT/US2002/022089 mailed on Nov. 5, 2002.

The International Preliminary Examination Report for PCT/US2002/022089 completed on Mar. 28, 2003.
The International Search Report for PCT/US2002/022091 mailed on Dec. 17, 2002.
The International Preliminary Examination Report for PCT/US2002/022091 completed on Apr. 19, 2004.
The International Search Report and Written Opinion for PCT/US2004/034603 dated Oct. 6, 2006.
The International Search Report for PCT/US2002/022291 mailed on Nov. 7, 2002.
The International Preliminary Examination Report for PCT/US2002/022291 completed on Feb. 25, 2003.
The International Search Report for PCT/US2002/22087 mailed on Nov. 12, 2002.
The International Preliminary Examination Report for PCT/US2002/022087 completed on Mar. 7, 2003.
The International Search Report for PCT/US2002/022292 mailed on Jan. 30, 2003.
The International Preliminary Examination Report for PCT/US2002/022292 completed on Mar. 7, 2003.
The International Search Report for PCT/US2002/022293 mailed on Nov. 7, 2002.
The International Preliminary Examination Report for PCT/US2002/022293 completed on Apr. 7, 2003.
The International Search Report for PCT/US2002/019887, mailed on Nov. 5, 2002.
The International Search Report for PCT/US2002/020687 mailed on Oct. 2, 2002.
The Written Opinion for PCT/US2002/020687 mailed on Apr. 25, 2003.
The International Preliminary Examination Report for PCT/US2002/020687 completed on Jul. 23, 2003.
The International Search Report and Written Opinion for PCT/US2006/23248 mailed on Jul. 3, 2008.
The International Search Report and Written Opinion for PCT/US2006/023363, mailed on Jul. 2, 2008.
The International Search Report and Written Opinion for PCT/US2006/23246, mailed on Jul. 3, 2008.
The International Search Report and Written Opinion for PCT/US2006/023368, mailed on Jul. 11, 2008.
The International Search Report and Written Opinion for PCT/US2008/064136, mailed on Sep. 26, 2008.
Aoki et al., "Parallel and Bi-Directional Optical Interconnect Module Using Vertical Cavity Surface Emitting Lasers (VCsels) and 3-D Micro Optical Bench (MOB)", *1999 Digest of the LEOS Summer Topical Meetings, Nanostructures and Quantum Dots/WDM Components/VCSELs and Microcavaties/RF Photonics for CATV and HFC Systems*, 1999, pp. 9-10.
Arnoson, L.B. et al., "Low-cost Multimode WDM for Local Area Networks Up to 10 Gb/s", *IEEE Photonics Technology Letters*, V. 10 No. 10 (Oct. 1998), pp. 1489-1491.
Ayliffe et al., "Optomechanical Electrical and Thermal Packaging of Large 2D Optoelectronic Device Arrays for Free-Space Optical Interconnects", *Proceedings of SPIE: Optics in Computing '98*, V. 3490 (May 1998), pp. 502-505.
Basavanhally et al. "Optoelectronic Packaging of Two-Dimensional Surface Active Devices", *IEEE Transactions on Components, Packaging, and Manufacturing Technology—Part B: Advanced Packaging*, V. 19 No. 1 (Feb. 1996), pp. 107-115.
Boisset et al., "On-Die Diffractive Alignment Structures for Packaging of Microens Arrays with 2-D Optoelectronic Device Arrays", *IEEE Photonics Technology Letter*, V. 8 No. 7, Jul. 1996, pp. 918-920.
Chou et al., "Multilayer High Density Flex Technology", *Electronic Components and Technology Conference: 1999 Proceeding*, Jun. 1-4, 1999, pp. 1181-1189.
Cryan, C.V., "Two-Dimensional Multimode Fibre Array for Optical Interconnects", *IEEE Electronic Letters Online*, V. 34, No. 6 (Mar. 1998), pp. 586-587.
Datta et al., "A Low-cost Electroless Plating Method for Producing Flip-chip Bondable and Wire-bondable Circuit Pads for Smart Pixel Application", *IEEE Lasers and Electro-Optics Society Annual Meeting, LEOS '98*, Orlando Florida, Dec. 1-4, 1998, pp. 99-100.

Fiore, A. et al. "Postgrowth Tuning of Semiconductor Vertical Cavities for Multiple-Wavelength Laser Arrays", *IEEE Journal of Quantum Electronics*, V. 35 No. 4 (Apr. 1999), pp. 616-623.
Geib, K.M. et al. "Monolithically Integrated VCELs and Photodetectors for Microsystem Applications", *Lasers and Electro-Optics Society Annual Meeting, IEEE*, Orlando, Dec. 1-4, 1998, V. 2, pp. 27-28.
Giboney, K.S., "Parallel-Optical Interconnect Development at HP Laboratories", *Proceedings of SPIE: Optoelectronic Interconnects and Packaging IV*, V. 3005 (Apr. 1997), pp. 193-201.
Goldstein et al., "Fluxless Flip-Chip for Multichip Modules", *IEEE Multi-Chip Module Conference Proceedings*, Santa Cruz CA, Feb. 6-7, 1996, pp. 39-43.
Hall et al., "Packaging of VCSEL, MC-LED and Detector 2-D Arrays", *IEEE: Electronic Components and Technology Conference*, Seattle WA, May 25-28, 1998, pp. 778-782.
Hayashi et al., "Optical Module with MU Connector Interface Using Self-Alignment Technique by Solder-Bump Chip Bonding", *Electronic Components and Technology Conference*, Orlando FL, May 28-31, 1996, pp. 13-19.
Imler et al., "Precision Flip-chip Solder Bump Interconnects for Optical Packaging", *IEEE Electronic Components and Technology Conference*, San Diego CA, May 18-20, 1992, pp. 508-512.
Ishida et al., "Two-Dimensionally Arranged 24-Fiber Optical Connectors", *Conference on Optical Fiber Communication: OFC '97*, Dallas Texas, Feb. 16-21, 1997, pp. 189-190.
Jöhnck et al., "8×8 POF Based Interchip Interconnection with 2.5 Gbit/s Per Channel Data Transmission", *$24^{th}$ European Conference On Optical Communication*, Madrid Spain, Sep. 20-24, 1998, pp. 35-36.
Kosaka et al., "Plastic-Based Receptacle-Type VCSEL-Array Modules with One and Two Dimensions Fabricated Using the Self-Alignment Mounting Technique", *$47^{th}$ Proceedings of the IEEE Electronic Components and Technology Conference*, San Jose CA, May 18-21, 1997, pp. 382-390.
Koyabu et al. "Fabrication of Two-Dimensional Fiber Arrays Using Microferrules", *IEEE Transaction on Components, Packaging, and Manufacturing Technology: Part C*, V 21, No. 1 (Jan. 1998), pp. 11-19.
Kudo et al., "Multiwavelength Microarray Semiconductor Lasers", *Electronics Letters, IEEE Stevenage*, V. 34, No. 21, Oct. 15, 1998, pp. 2037-2038.
Lee et al. "Self-Aligned Integration of 8 × 1 Micromachined Micro-Fresnel Lens Arrays and 8 × 1 Vertical Cavity Surface Emitting Laser Arrays for Free-Space Optical Interconnect", *Electron Devices Meeting, IEDM '94 Technical Digest, International*, San Francisco, Dec. 11-14, 1994, pp. 761-764.
Liu et al., "Design, Implementation and Characterization of a Hybrid Optical Interconnect for a Four-Stage Free-Space Optical Backplane Demonstrator", *Applied Optics*, V. 37 No. 14 (May 10, 1998), pp. 2895-2914.
MacDougal et al., "Wavelength Shift of Selectively Oxidized $Al_xO_y$-AlGaAs-GaAs Distributed Bragg Reflectors" *Photonics Technology Letters, IEEE*, V. 9, No. 7 (Jul. 1997), pp. 884-886.
Maj et al., "Interconnection of a Two-Dimensional Array of Vertical-Cavity Surface-Emitting Lasers to a Receiver Array by Means of a Fiber Image Guide," *Applied Optics*, V. 39 No. 5 (Feb. 10, 2000), pp. 683-689.
McCormick, F.B., "Smart Pixel Optics and Packaging", *IEEE/LEOS 1996 Summer Tropic-1 Meeting: Advanced Applications of Lasers in Materials Processing, 1996/Broadband Optical Networks/Smart Pixels/Optical MEMs and Their Applications*, Aug. 5-9, 1996, pp. 45-46.
Ohki et al., "Multi-Channel Optical Coupling Between VCSEL Arrays and Multimode Optical Fibers for a 40-Channel Parallel Optical Interconnection Module," *1998/IEEE/LEOS Summer Topical Meetings: Broadband Optical Networks and Technologies: An Emerging Reality/Optical MEMS/Smart Pixels/Organic Optics and Optoelectronics*, Monterey CA, Jul. 20-24, 1998, pp. 47-48.
Ouimet et al. "Wirebonding PBGA Manufacturing Challenges From Fine to Ultrafine Pitch, " *Future Fab International*, pp. 297-301, accessed Aug. 27, 2008 at http://webarchive.org/web/20010711092112/http://www.chips.ibm.com/products/interconnect . . . (12 pages).

Proudley et al., "Fabrication of Two Dimensional Fiber Optic Arrays for an Optical Crossbar Switch," *Optical Engineering*, V. 33 No. 2 (Feb. 1994), pp. 627-635.

Pu, R., et al., "Thermal Resistance of VCSEL's Bonded to Integrated Circuits," *IEEE Photonics Technology Letters*, IEEE Inc., New York, V. 11, No. 12, Dec. 1999, pp. 1554-1556.

Sasian et al., "Fabrication of Fiber Bundle Arrays for Free-Space Photonic Switching Systems," *Optical Engineer*, V. 33 No. 9 (Sep. 1994), pp. 2979-2985.

Söchtig et al. "Replicated Plastic Optical Components for Optical Micro Systems," *1998 IEEE/LEOS Summer Topical Meetings: Broadband Optical Networks and Technologies: An Emerging Reality/Optical MEMS/Smart Pixels/Organic Optics and Optoelectronics*, Monterey CA, Jul. 20-24, 1998, pp. 37-38.

Tooley, F.A.P., "Challenges in Optically Interconnecting Electronics", *IEEE Journal of Selected Topics in Quantum Electronics*, V. 2, No. 1 (Apr. 1996), pp. 3-13.

European Search Report for EP Patent Application No. 03748945.7 dated Sep. 18, 2009.

Office Action for Korean Patent Application No. 7011845/2009 transmitted Sep. 21, 2009.

EP Communication for European Patent Application No. 03748945.7 dated Sep. 18, 2009.

Office Action for Korean Patent Application No. 7011845/2009 transmitted Sep. 21, 2009.

Supplementary European Search Report for EP 02 73 9971 dated Jun. 25, 2004 (3 pages).

International Search Report dated Nov. 12, 2002.

International Search Report dated Dec. 13, 2002.

International Search Report dated Dec. 17, 2002.

Ahadian, J.F., et al., "Practical OEIC's Based on the Monolithic Integration of GaAs-InGap LED's with Commercial GaAs VLSI Electronics", IEEE Journal of Quantum Electronics, vol. 34, No. 7, pp. 1117-1123, Jul. 1998.

Alduino, A.C. et al., "Quasi-Planar Monolithic Integration of High-Speed VCSEL and Resonant Enhanced Photodetector Arrays", IEEE Photonics Technology Letters, vol. 11, No. 5, pp. 512-514, May 1999.

Corbett, B. et al., "Resonant Cavity Light Emitting Diode and Detector Using Epitaxial Liftoff", IEEE, vol. 5, No. 9, pp. 1041-1043, Sep. 1993.

Geib, K.M. et al., "Monolithically Integrated VCSELs and Photodetectors for Microsystem Applications", IEEE, pp. 27-28, 1998.

Goodman, J. et al., "Optical Interconnections for VLSI Systems", Proceedings of the IEEE, vol. 72, No. 7, pp. 850-865, Jul. 1984.

Goossen, K. W. et al., "GaAs 850 nm Modulators Solder-Bonded to Silicon", IEEE Photonics Technology Letters, vol. 5, No. 7, Jul. 1993.

Goossen, K.W. et al., "GaAs MQW Modulators Integrated with Silicon CMOS", IEEE Photonics Technology Letters, vol. 7, No. 4, pp. 360-362, Apr. 1995.

Hibbs-Brenner, M.K., et al., "VCSEL/MSM Detector Smart Pixel Arrays", IEEE, pp. 3 and 4, 1998.

Lesser, M.P. et al., "Bump Bonded Back Illuminated CCDs", SPIE, vol. 1656, pp. 508-516, 1992.

McLaren T. et al., "Assembly of VCSEL Based Smart Pixel Arrays", IEEE/LEOS Summer Topical Meeting: Smart Pixels, pp. 49 and 50, Aug. 1996.

Nakahara, T., et al., "Hybrid Integration of Smart Pixels by Using Polyimide Bonding: Demonstration of a GaAs p-i-n Photodiode/CMOS Receiver", IEEE Journal Of Selected Topics in Quantum Electronics, pp. 209-216, 1999.

Ohsaki, T., "Electronic Packaging in the 1990's - A Perspective From Asia", IEEE Transactions On Components, Hybrids, and Manufacturing Technology, vol. 14, No. 2, pp. 254-261, Jun. 1991.

Pommerrenig, D.H. et al., "Hybrid silicon focal plane development: an update", SPIE, vol. 267, pp. 23-30, 1981.

Pu, R. et al., "Comparison of Techniques for Bonding VCSELs Directly to ICs", SPIE vol. 3490, pp. 498-501, Jun. 2005.

Pu, R. et al., "Hybrid Integration of VCSELs to Foundry Fabricated Smart Pixels", IEEE/LEOS Spring Meetings, pp. 25 and 26, 1997.

Written Opinion for PCT/US02/20012.

EP Communication for European Patent Application No. 02749969.8 dated Nov. 5, 2009.

EP Communication for European Patent Application No. 03748945.7 dated Dec. 22, 2009.

Office Action issued in Chinese Patent Application No. 200480032155.8 and dated Jun. 23, 2010. (English text provided).

Office Action issued in Korean Patent Application No. 7027298/2008 and mailed May 10, 2010.(English summary provided).

* cited by examiner

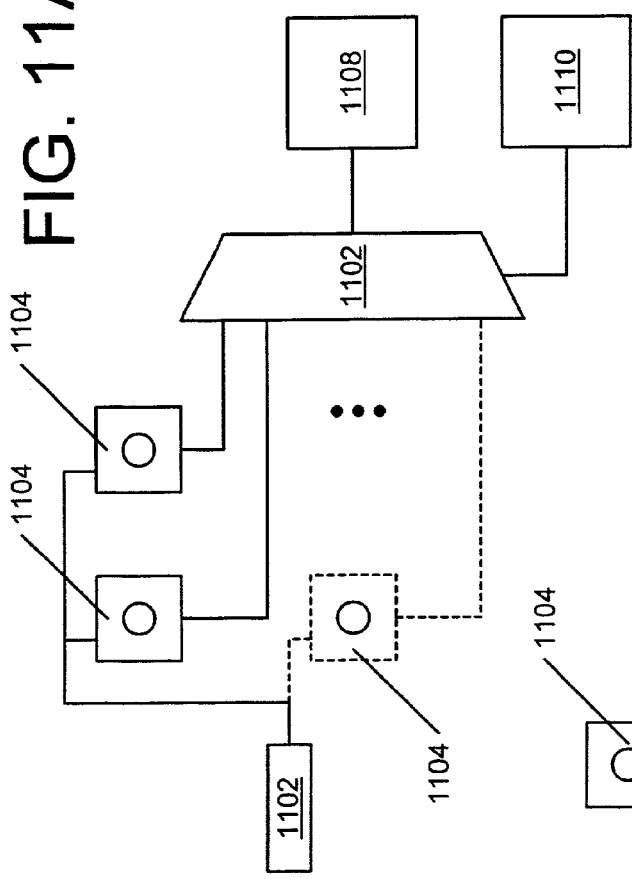
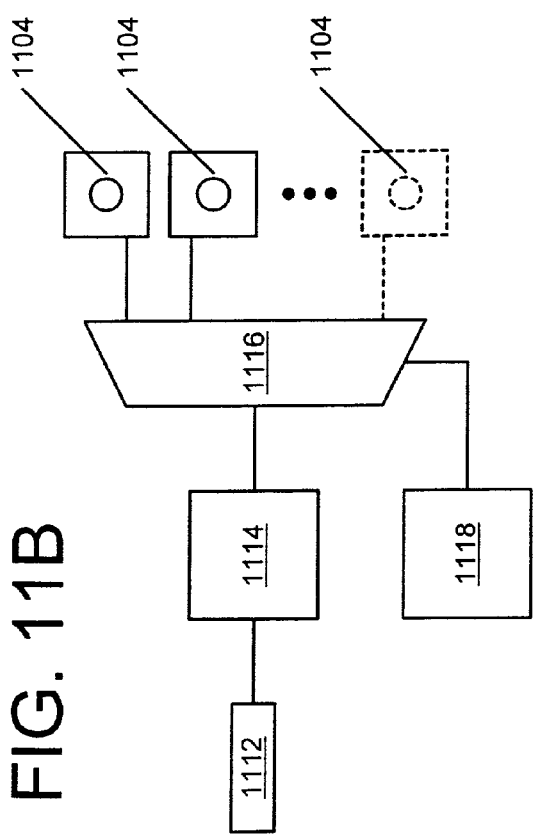

REDUNDANT OPTICAL DEVICE ARRAY

FIELD OF THE INVENTION

This invention relates to arrays of optical devices such as lasers and photodetectors and, more particularly, to arrays of optical devices having increased yield and longer lifetime.

BACKGROUND OF THE INVENTION

Over the past few years the dramatic increase in the use of fiber optics in communications systems has created a tremendous need for both cheaper and more reliable optical components. Unfortunately, the limited materials usable to create acceptable laser diodes and photo detectors for use in such devices effectively limits the mean time between failures (MTBF) that can be achieved for such devices.

Typically diode lasers or photodetectors are fabricated by growing the devices on a semiconductor substrate. Depending upon the particular devices and there design, this may entail the use of known techniques such as liquid-phase epitaxy, metal-organic vapor-phase epitaxy, molecular beam epitaxy. Each of these techniques has its advantages and disadvantages in terms of the quality, reliability, and frequency of defect occurrence.

Once the active portion of the device is produce by the epitaxial growth process, the devices are then further processed into device chips. During these processes dielectric films and various metals are deposited on the semiconductor, for example, to isolate parts or create contacts. Finally, photolithography and/or chemical or physical etching are used to finish the devices. Once the device structures are fully formed in the semiconductor wafer, each device is separated from the wafer, for example, by cleaving.

FIGS. 1A and 1B show two variants of an example optical device of the prior art, a semiconductor laser diode. The specific devices 110, 120 shown in FIGS. 1A and 1B are vertical cavity surface emitting lasers (VCSEL). As shown, each device 110, 120 is contained in an approximately 200 micrometer (micron) square area of semi-conductor material. Each device 110, 120 has an optical window 112, 122 of approximately 17-19 micron diameter. The device 110, 120 is connected via a trace 114, 124 to a bonding pad 116, 126 approximately 100 microns square. In FIG. 1A, the bonding pad serves as the positive ("+") contact and in FIG. 1B, the bonding pad serves as the negative ("−") contact.

FIG. 2 shows multiple individual VCSELs that have been combined to form at least a 2×3 array of lasers. The devices 200 are arranged so that the spacing between each laser (i.e. the "pitch") is approximately 250 microns. Such arrays can be relatively reliable, because each individual laser device 200 can be operationally tested before it is integrated into the array. However, once the array is created, if an individual element fails, either the entire array must be replaced or the array becomes degraded because there is no easy way to repair it.

Moreover, even if the array is created from macrostructures, for example, so that there are 1×4 discrete devices on a common carrier. If any one of the devices is defective, the entire carrier becomes useless or the individual good devices must be removed from it and used individually.

All of the above results in arrays that are both costly to produce and, in their overall configuration, have an overall MTBF of the least reliable device in the array.

Thus there remains a need in the art for a way to produce a chip incorporating an array of optical devices that is less costly to produce.

There remains a further need in the art for an array that is easy to repair at low cost.

BRIEF DESCRIPTION OF THE DRAWINGS

FIG. 11A shows one functional example of circuitry for selecting from among two or more redundant devices according to the invention;

FIG. 11B shows another functional example of circuitry from among two or more redundant devices according to the invention;

SUMMARY OF THE INVENTION

We have devised a way to create electro-optical chips that avoid the problems of the prior art.

In particular, we have created a way to deploy large numbers of optical devices in a manner which provides a higher overall yield and greater reliability. Depending upon the particular implementation, further advantages such as reparability after deployment, and performance optimization can be achieved.

One aspect of the invention involves an optical module has multiple optical devices. At least two of the multiple optical devices are a group. Each of the optical devices in the group are individually selectable relative to the others. The optical module also has a controller, coupled to the devices such that the controller can select which of the devices in the group will be active at a given time.

Another aspect of the invention involves a method of creating an optical chip, having redundant devices, for use in an opto-electronic unit involves growing active portions of multiple optical devices on a wafer, processing the wafer to create complete optical devices, creating individual optical devices, grouping the devices; and connecting the devices in a group to a control circuit such that, common data can be received by any of the devices in the group but the common data will only be handled by the device in the group that is active.

Yet another aspect of the invention involves a communications network that has a first transmitter having a number of usable channels, a first receiver, and optical fibers connecting the first transmitter to the first receiver. The first transmitter has multiple lasers, at least some being selectable as either active or backup lasers. The multiple lasers are controllable such that, if a specific channel is in use by an active laser and a laser failure occurs for that channel, a redundant laser can be substituted for the active laser and, after the substitution, the specific channel can be used using the redundant laser.

These and other aspects described herein, or resulting from the using teachings contained herein, provide advantages and benefits over the prior art.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Figures 1A, 1B:
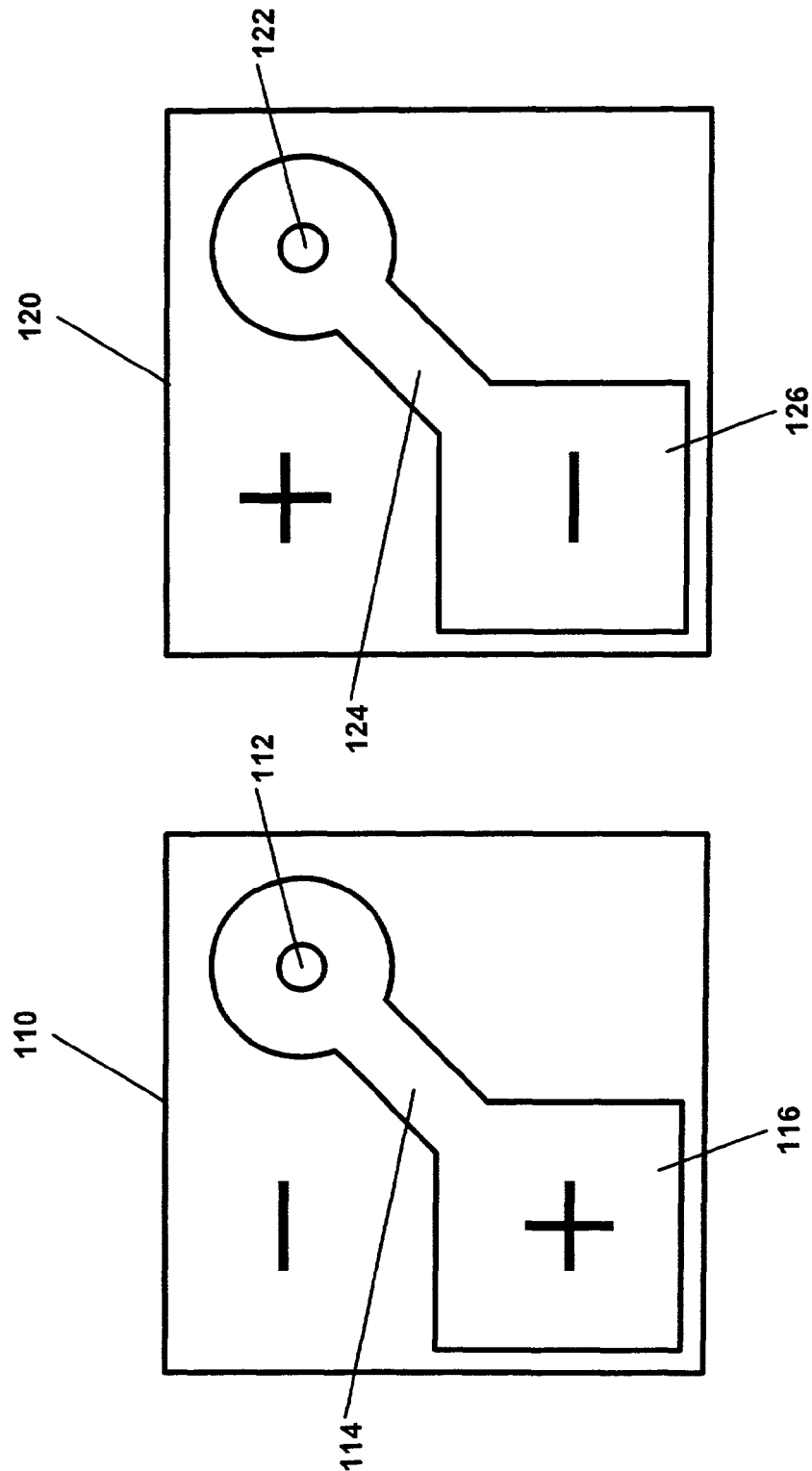
FIGS. 1A and 1B show two variants of an example semiconductor laser diode optical device of the prior art.
Figure 2:
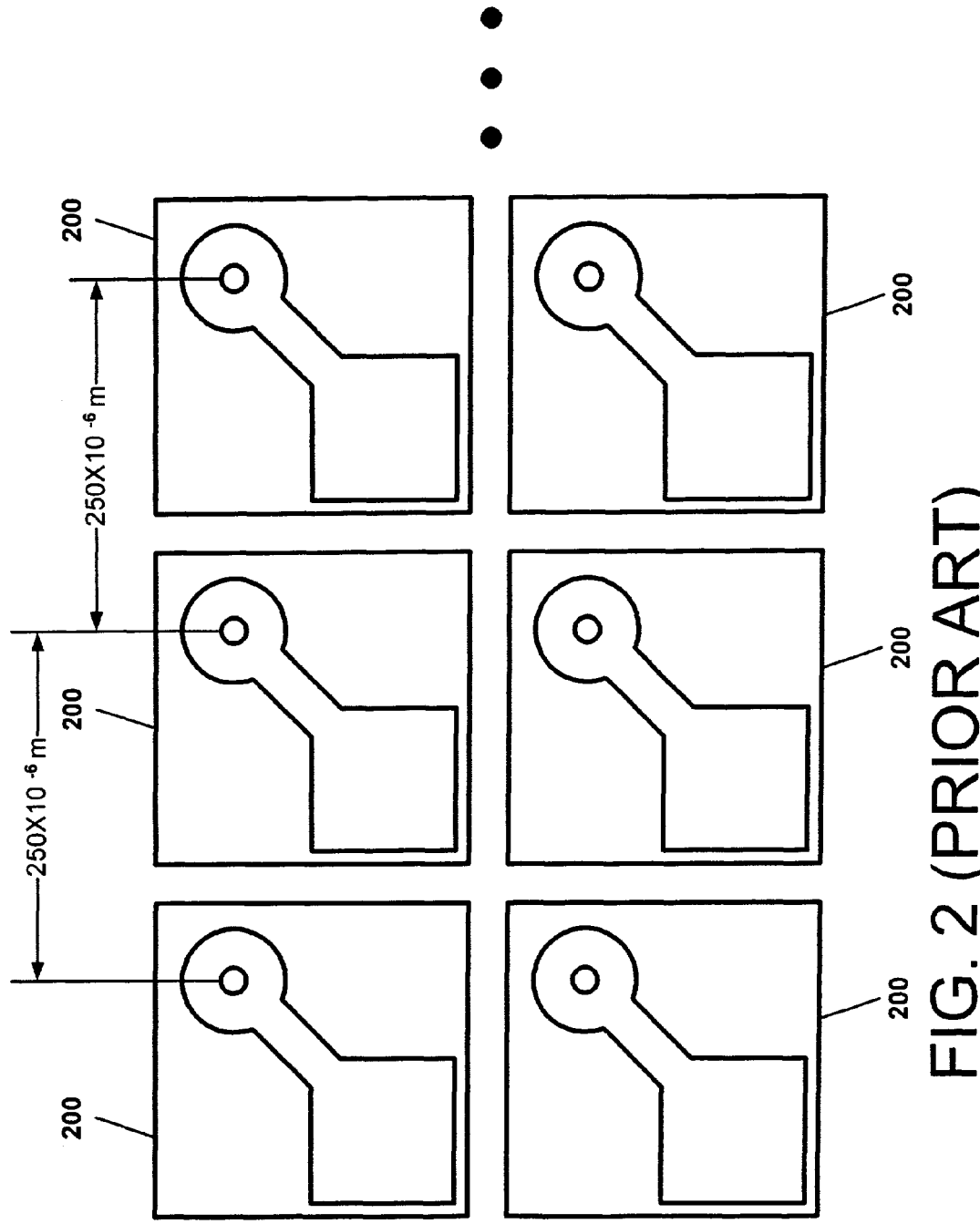
FIG. 2 shows multiple VCSEL's of FIG. 1 arranged in an array according to the prior art.
Figure 3:
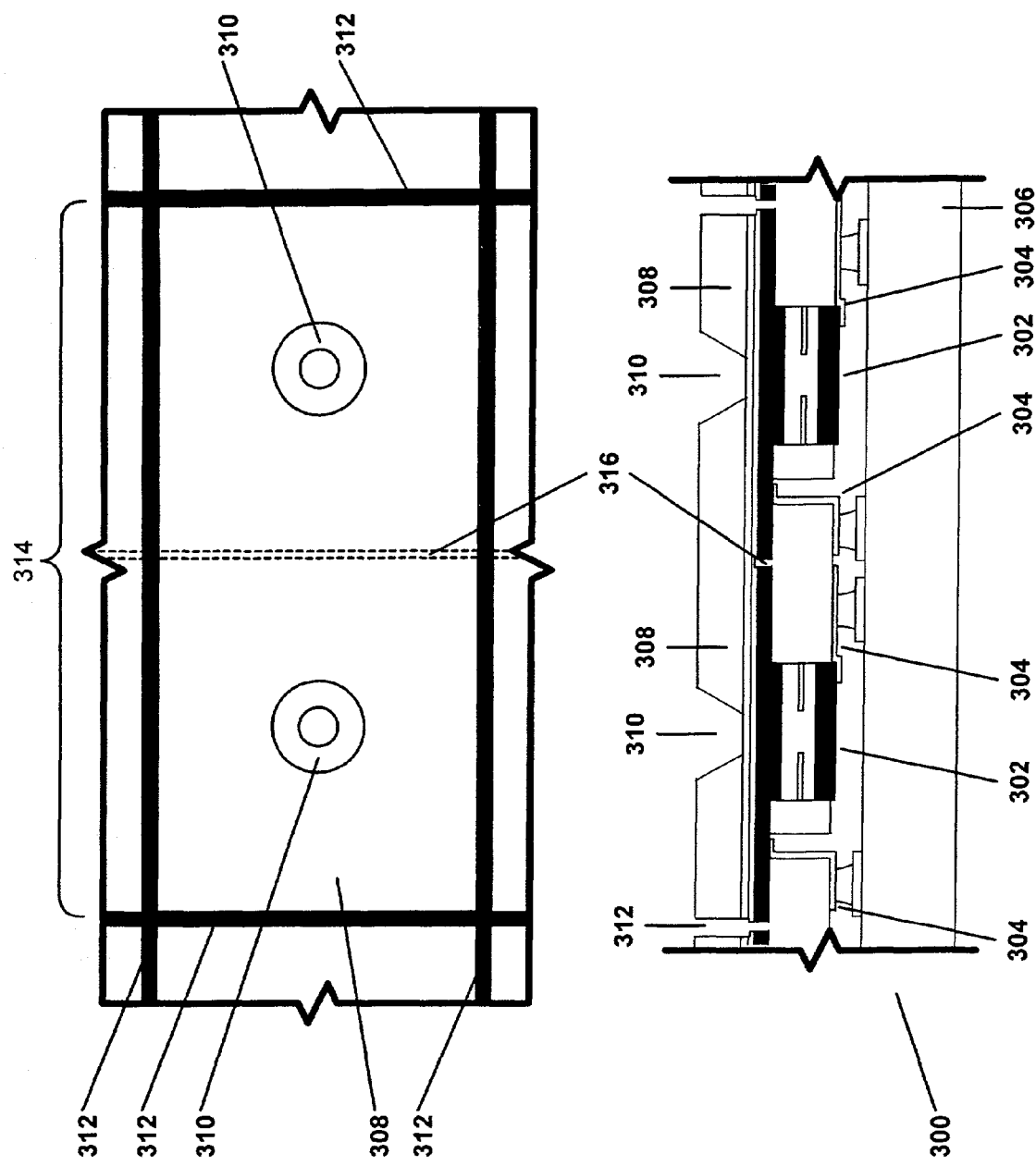
FIG. 3 shows a redundant laser pair from an array in accordance with the invention.

FIG. 3 shows a portion 300 of a two dimensional array of lasers 302 created according to the principles of the invention. The portion shows two individual laser devices 302 bonded via contact pads 304 to an electronic chip 306. As shown, the devices 302 are bottom emitting laser devices that have been flip chipped bonded to the electronic chip, although as will be apparent from the description herein, bottom receiving, top emitting or top receiving devices can be used as well, particularly if the approaches of the commonly assigned U.S. patent applications entitled "Opto-Electronic Device Integration" filed concurrently herewith (now U.S. Pat. Nos. 6,620,642, 6,724,794, 6,753,197, and 6,790,691 which are incorporated herein by reference), are employed as part of the process.

Because the substrates 308 have not been removed or excessively thinned, emissions of the lasers occur via access ways 310 created in the substrate 308 on which the laser devices were supported to allow for close optical access to the devices. The spacing between the access ways, i.e. the pitch, is such that each of the lasers 302 can be either directly coupled to a single optical fiber, or directed into a common optical fiber, for example, by focusing the light output using a micro lens or guiding the light using an optical waveguide. Thus, depending upon the particular lasers and fibers used, the pitch between the two lasers can be as small as 5-10 microns for direct lasing into a single mode fiber or 50-100 microns for direct lasing into a multimode fiber. Alternatively, if an optical wave guide or focussing lens is used, the inter-device pitch becomes less important and may be as much as a 100 microns or more as needed.

During device creation the lasers are separated into individual devices by patterning the laser wafer prior to bonding with the electronic chip, for example as shown in the incorporated commonly assigned application entitled "Opto-Electronic Device Integration," now U.S. Pat. No. 6,620,642. Additionally, the devices are patterned with grouping trenches 312 which physically and electrically define groups by creating boundaries separating individual groups 314 of redundant devices. The grouping trenches 312 ensure isolation among the individual groups while allowing for carrier movement among the devices within the group via the electrically conductive substrate 308.

All the devices in a group 314 share a common connection (either the positive or negative contact) so that any signal to be sent or received by any of the devices can be sent or received by any other of the devices in the group irrespective of which one is selected as being active using the contacts. In other words, if three lasers constitute a group in an optical module, such as an optical transmitter, they will be coupled to a single optical fiber, all have one contact in common and all have individual opposite polarity contacts. If the transmitter were to send data through the optical fiber, the same signal would be sent irrespective of which laser was active at the time. Moreover, from the perspective of the functions of any prior art optical transmitter, the transmitter incorporating the invention can be oblivious to which laser in the group is active. Advantageously, the purchaser or user of the transmitter, or any other device employing the invention, need not know it contains device redundancy. The features and elements that allow selection of the particular active laser can be wholly transparent to anyone other than the manufacturer or can be made accessible to third parties to varying degrees.

Figure 4B:
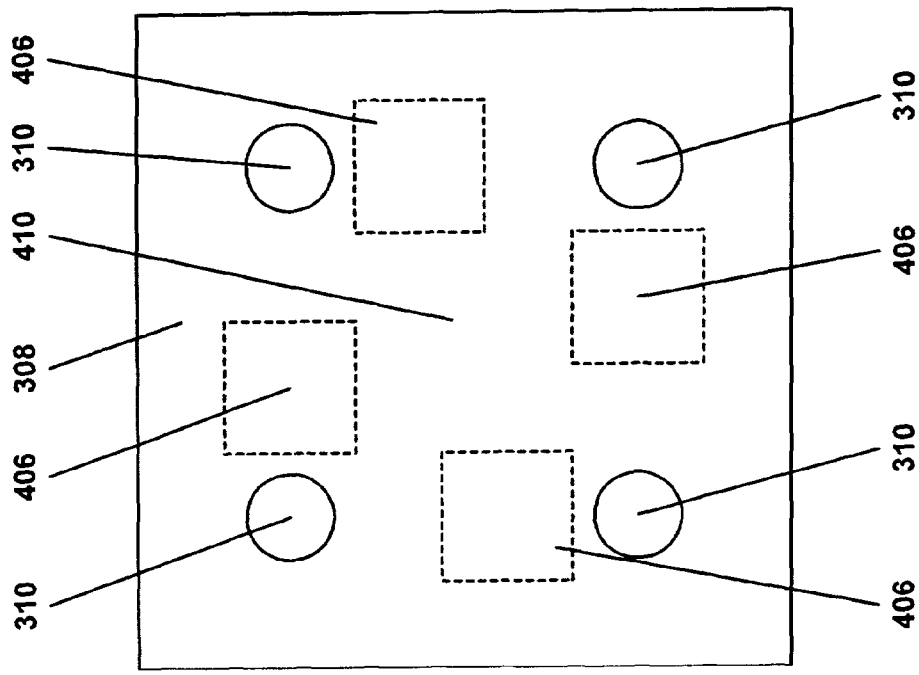
FIG. 4B functionally shows contacts for the group of FIG. 4A.
Figure 4A:
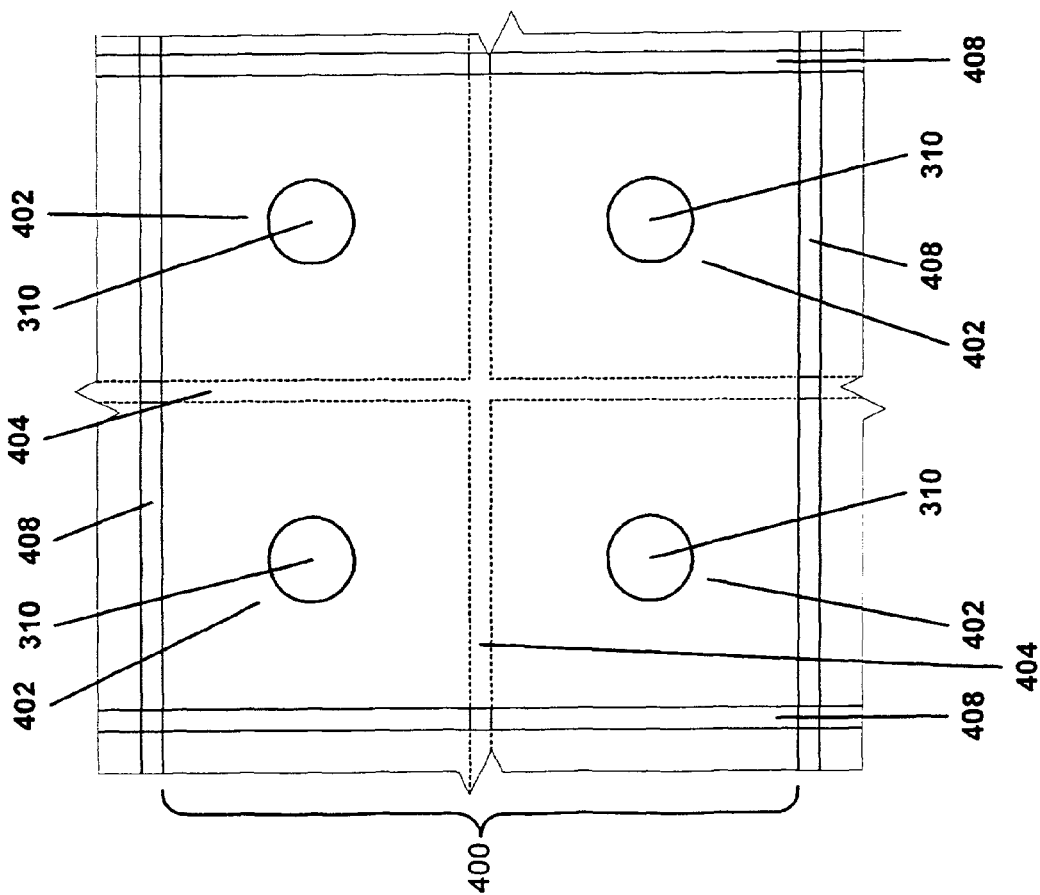
FIG. 4A shows a group of four redundant lasers from an array according to the invention.

FIG. 4A shows a portion of a laser array employing groups 400 of four lasers 402 as a redundant group. As shown, the individual devices have been separated through patterning of separation trenches 404 which isolate the individual device contacts 406, and groups 400 have been created by patterning of grouping trenches 408 which isolate the common contact 410 from the common contact(s) of other neighboring groups. As with FIG. 3, access ways 310 are provided through the substrate to provide for close optical access to the lasers. FIG. 4B is a functional representation of the group of FIG. 4A but showing the discrete contacts 406 for each laser and the substrate 308, which is used as the common contact.

Advantageously, by grouping the lasers in fours, significant flexibility can be obtained. For example, the best two of the four lasers can be used as a redundant pair with or without the remaining two lasers serving as back up devices for either laser in the pair, the best of the four lasers can be employed as a primary laser with each of the remaining three being available should the primary laser fail, or should any individual laser in the group be bad, it can be disregarded entirely.

Figure 5:
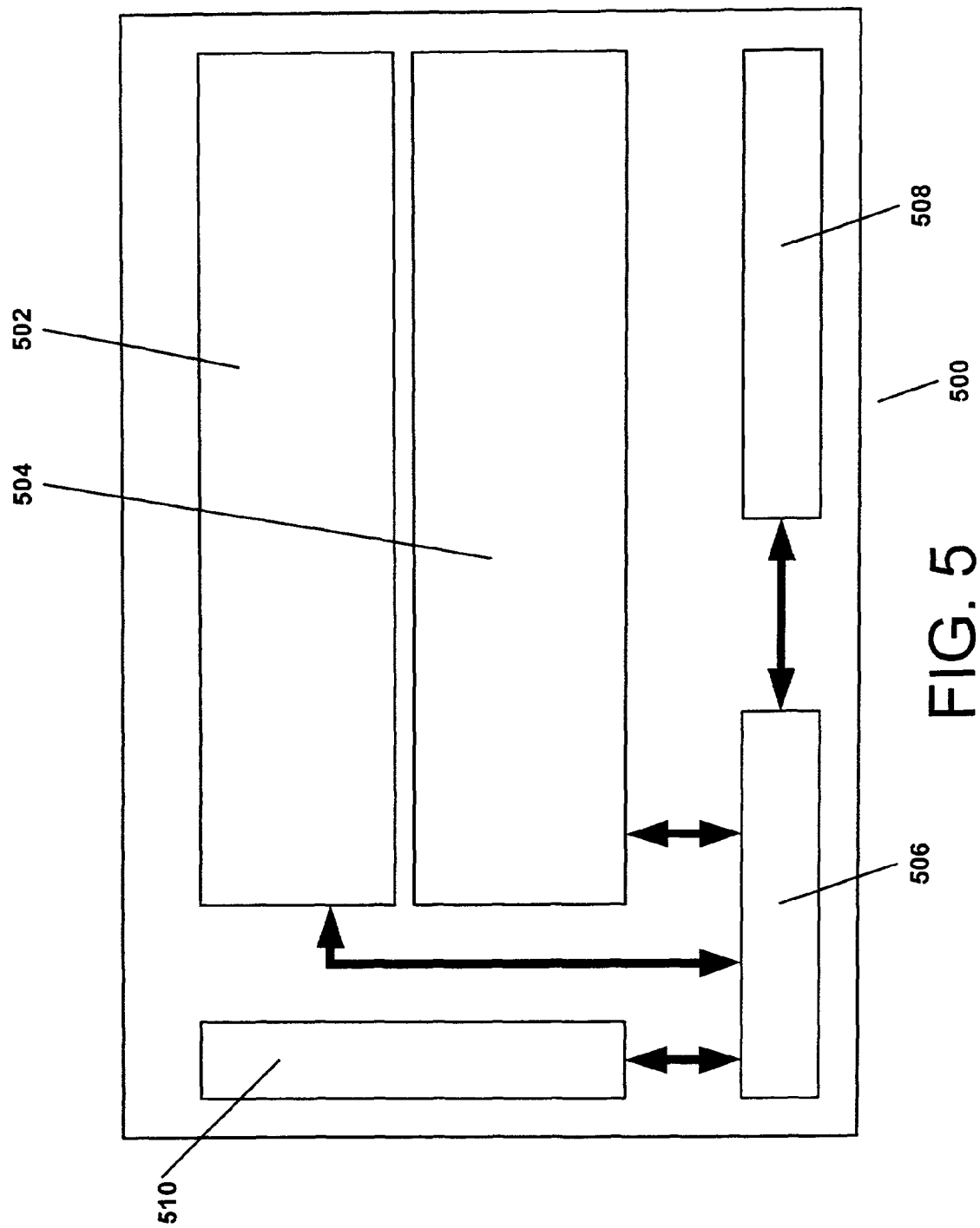
FIG. 5 shows the functional components of an opto-electronic chip suitable for use in accordance with the invention.

FIG. 5 shows the functional components of an opto-electronic device 500 suitable for employing the principles of the invention. Functionally, the device includes a laser portion 502 which contains an array of individual lasers. The device also includes a detector portion 504 which includes an array of individual photodetectors. A control portion 506 is provided which contains the control electronics for accessing the individual lasers and/or detectors. Additionally, a storage portion 508 can optionally be provided, as will be described in greater detail below. Finally, the device includes an interface portion 510 through which the opto-electronic chip may be electrically or programmatically connected to other devices or control electronics. Depending upon the particular implementation, the interface portion 510 may be functionally located between the control portion 506 (and/or the storage 508 if this option is used) and the devices 502, 504, for example where the control 506 and/or the storage 508 can be provided by a third party. In other variants, the interface 510 may provide a way to bypass or override either or both of the control portion 506 and/or storage 508 if either or both are present.

Functionally, the control portion 506 is, in whole or part, the "brains" of the opto-electronic chip 500. At least, it is the brains with respect to the redundancy feature. The control portion 506 is physically made up of the hardware used to activate the individual devices based upon, for example, information stored in the storage, and/or to specify, update and/or change the stored information to initialize the chip or reprogram it following a failure. Depending upon the particular implementation, the control portion will be a processor, for example, a microprocessor operating under program control, a state machine, hard wired circuitry or some combination thereof.

Depending upon the particular implementation, the storage will be in the form of static random access memory (SRAM), dynamic random access memory (DRAM or RAM), or some form of read only memory (ROM) which may be, for example, a device such as a programmable read only memory (PROM), an electronically programmable read only memory (EPROM), an electronically erasable programmable read only memory (EEPROM), a programmable logic device (PLD), etc. to name a few.

The storage 508 is accessible by the control portion 506 and is configured to allow the active device in each group to be specified. Optionally, the storage 508 can be further configured to keep track of redundant (i.e. back-up) devices and, as a further option, can be configured to specify the hierarchy or ordering for bringing on-line the remaining devices in the group if needed.

For example, Table 1 shows a simple table that can be employed for groups of device pairs. Each pair has a group address or identifier that uniquely identifies, directly or indirectly, each discrete group. A single bit is used to designate the active device, for example, with a binary 0 representing the first device in the group and a binary 1 representing the second device in the group.

TABLE 1

| Group Address | Active Device |
|---|---|
| | $X_0$ |

Table 2 shows an alternative arrangement for identifying the active device in the storage. As with Table 1, an address or identifier uniquely identifies the particular group. Associated with that address is a two-bit binary number, where each bit corresponds to one device in the group and is used to signify whether that device is to be active.

TABLE 2

| Group Address | Active Device |
|---|---|
| | $X_1X_0$ |

For example, a bit pattern of 00 would specify that neither device is active. Bit patterns of 01 or 10 would indicate that one or the other device in the pair is active. Depending upon the particular implementation, a bit pattern of 11 could, for example, be used to activate both devices for some special case or could simply be an invalid state.

Table 3 shows a similar arrangement for a chip having groups made up of four devices. In this case, a similar two bit binary number is used except, the actual number in binary is used to indicate the active device.

TABLE 3

| Group Address | Active Device |
|---|---|
| | $X_1X_0$ |

For example, a 00 would indicate that the first device in the group is active, a 01 would indicate the second device in the group is active. A 10 would indicate that the third device is active and a 11 would indicate that the fourth device is active.

Table 4 shows a more complex arrangement for keeping track of the active devices in a particular array having individual four device groups. As shown Table 4 includes an address as noted above. In addition, an eight-bit binary number ($X_1X_0A_1A_0B_1B_0C_1C_0$) is used to identify the particular laser device in the group that is the primary (i.e. active) device as well as a hierarchy for the remaining devices in the group.

TABLE 4

| Group Address | Primary Device | Secondary Device | Tertiary Device | Quartic Device |
|---|---|---|---|---|
| | $X_1X_0$ | $A_1A_0$ | $B_1B_0$ | $C_1C_0$ |

For example, for a particular address, an entry of 01110010 would indicate that the second device (01) is active. In the event that device was unusable or failed, the next device to be brought on-line is the fourth device. If that device were to fail, the next devices brought on-line thereafter would be, in order, the first followed by the third.

As can be appreciated, there are numerous ways other ways to identify active devices and/or specify alternative devices, either by employing some variant or combination of the above examples, or creating some other methodology, for example, by designating each laser with a unique address (irrespective of its group) and maintaining a list of the addresses for the lasers in each group in the order they are to be brought on line or providing space for settings for each laser, such as bias and modulation, and filling the setting information in for active lasers and/or setting the bias and/or modulation settings to zero and/or an invalid value to deactivate a laser.

In an alternative implementation, involving no storage for device selection, the devices incorporate fusible links that can be used to bring a device on- or off-line. For example, each device may incorporate two fusible links. Initially, neither link is blown so the device is inactive but available. To bring a device on line, circuitry is activated that causes a particular link to blow and renders the device active. In the event that device dies some time in the future, other circuitry can be enabled to blow the remaining link, rendering the device inactive. A redundant device in the group can then be brought on-line by blowing the first link for that redundant device in a similar manner.

Still other alternative implementations use a combination of storage and hard wiring or fusible links to accomplish the functions of the control and/or storage.

Figure 6:
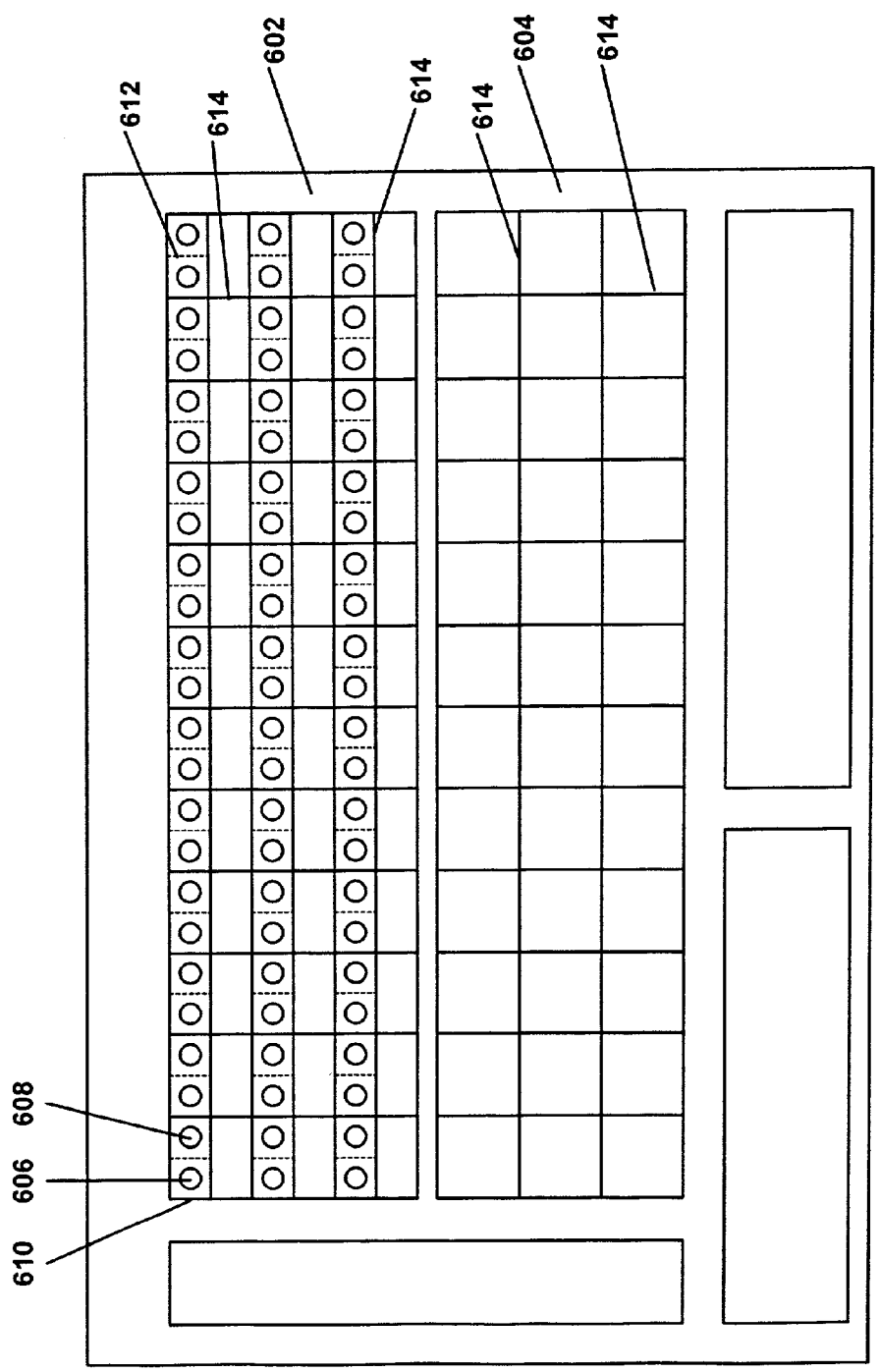
FIG. 6 shows the chip of FIG. 5 employing pairs of redundant lasers according to the invention.

FIG. 6 shows an opto-electronic device of the type shown in FIG. 5 in greater detail and constructed according to the principles of the invention. As shown, the detector portion 604 is made up of 36 individual detectors and the laser portion 602 is made up of 36 pairs of redundant lasers. As shown, the individual lasers 606, 608 in a group 610 are separated by device trenches 612 and the groups are separated from each other by grouping trenches 614.

In addition, there are available areas 616 between adjacent rows of the paired redundant lasers. Depending upon the particular implementation, those areas may be wholly unused, may be occupied by lasers of other wavelengths than those of the redundant pair, or may represent additional lasers of the same type as the redundant pairs which have been disabled for one reason or another.

Figure 7:
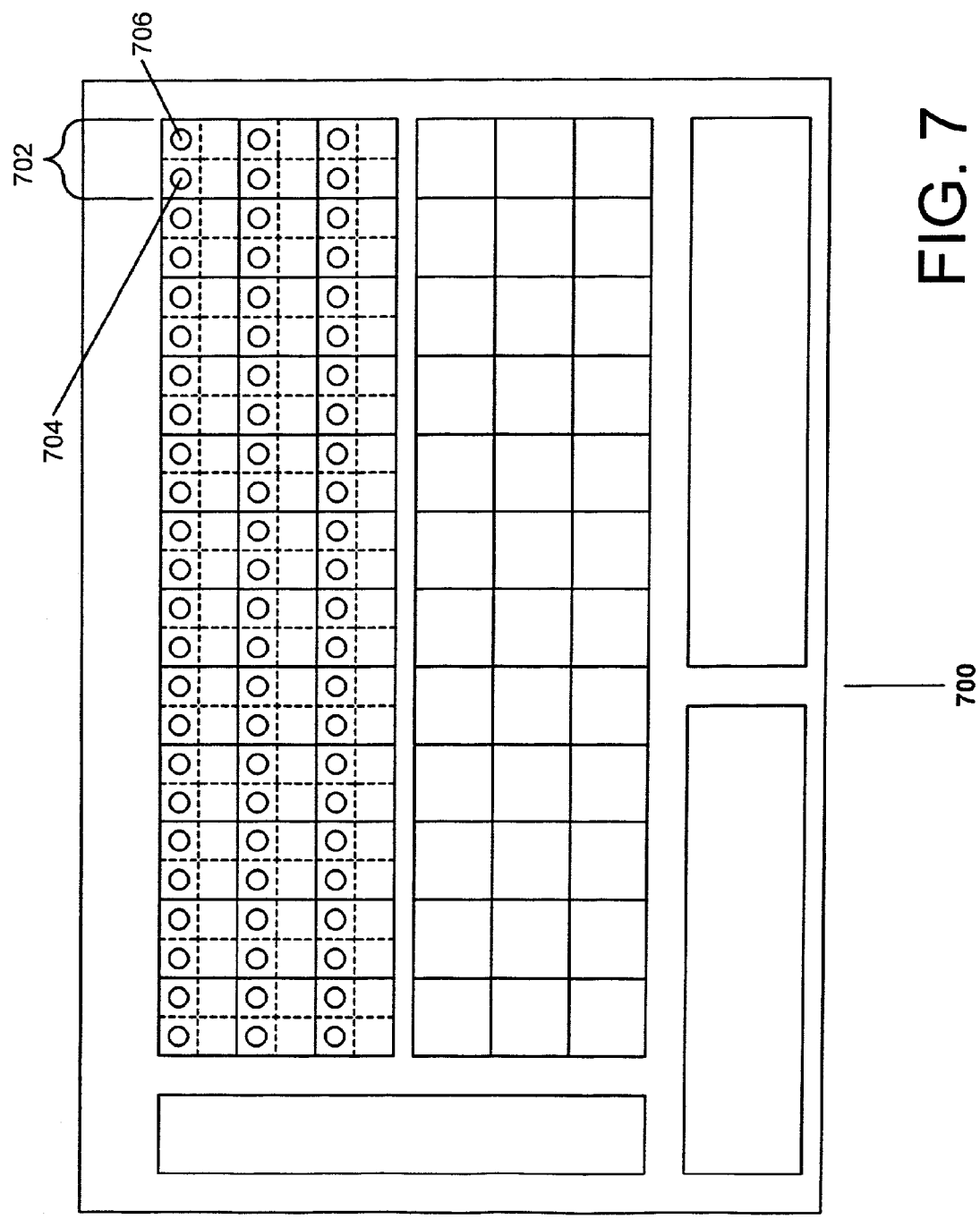
FIG. 7 shows an alternative variant to the chip of FIG. 6.

FIG. 7 shows an opto-electronic chip 700 similar to that of FIG. 6 except that the array has been patterned as if four discrete devices were present to make up a group 702. However, each group contains only two lasers 704, 706.

Figure 8:
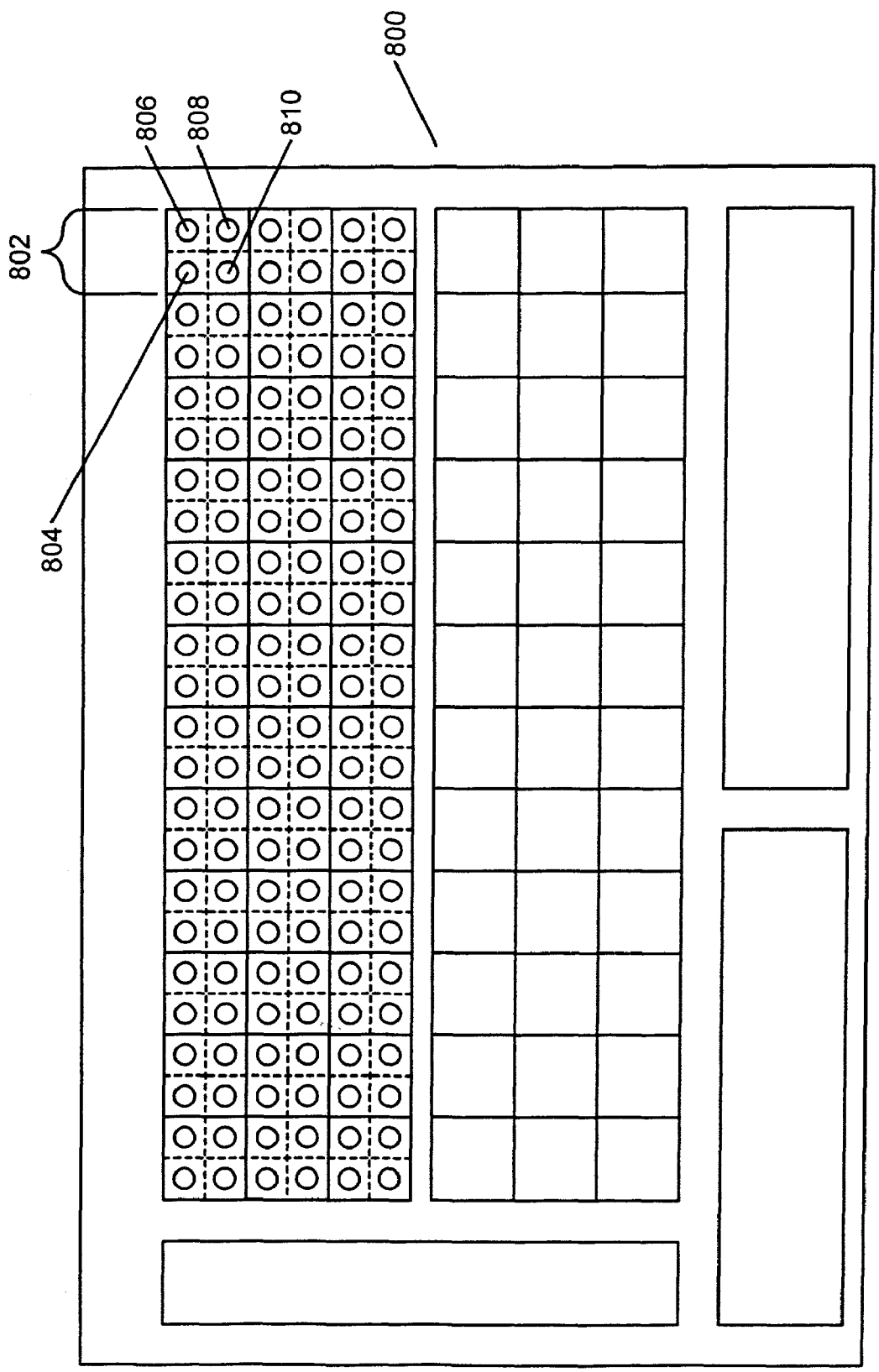
FIG. 8 shows the chip of FIG. 5 employing groups of four redundant lasers according to the invention.

FIG. 8 shows a chip 800 similar to the chip of FIG. 6 except that each individual group 802 is now made up of four individual lasers 804, 806, 808, 810.

Figure 9:
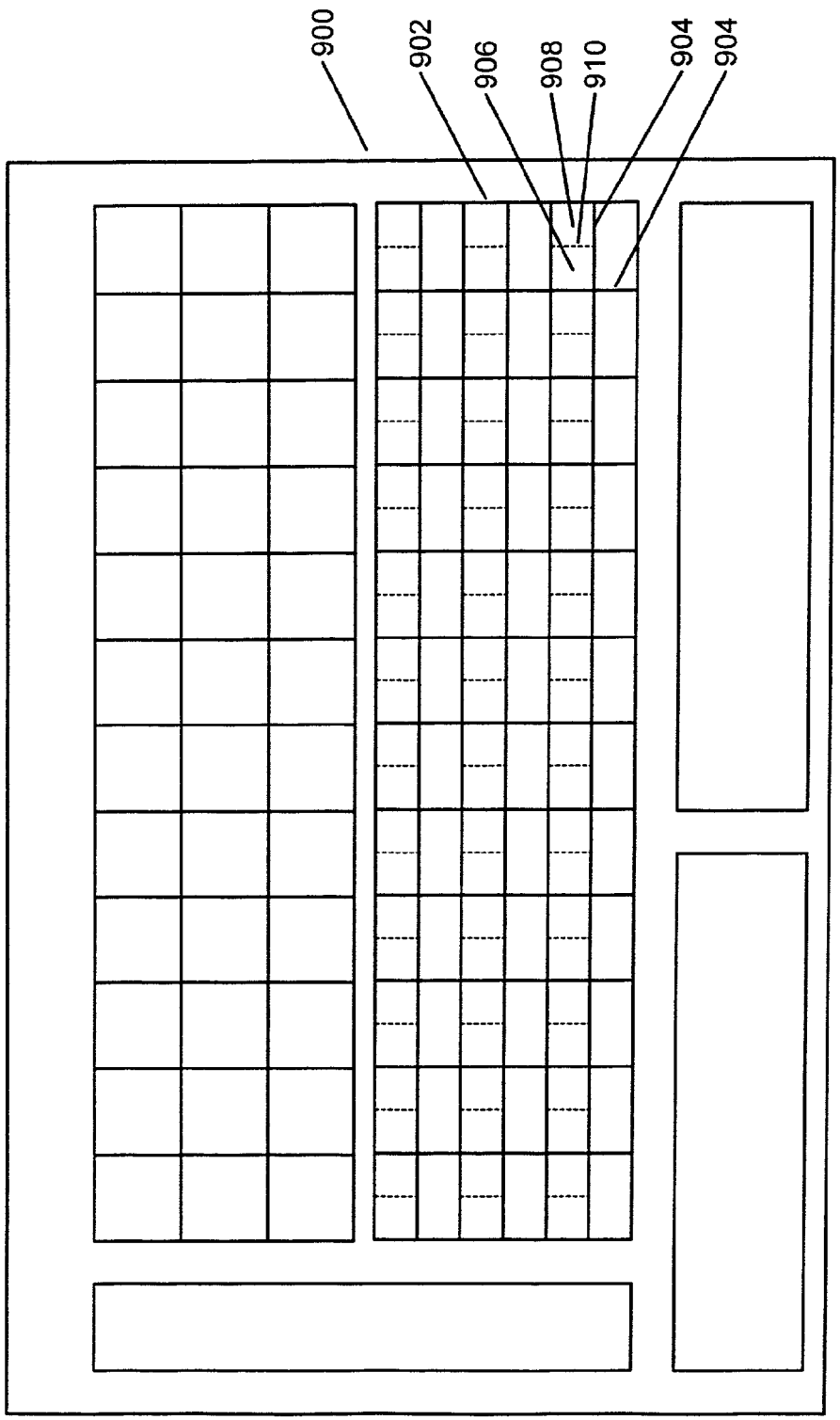
FIG. 9 shows the chip of FIG. 5 employing pairs of redundant photodetectors according to the invention.

FIG. 9 shows a chip 900 like the device of FIG. 5 but having pairs 902 of redundant photodetectors. As shown, the photodetectors are grouped, like the lasers of FIG. 6, by grouping trenches 904 and individual photo detectors 906, 908 within a group are separated by device trenches 910.

It is important to note in connection with redundant detectors, that the use of redundant detectors will require that either some additional device be used to redirect the incident light from one detector to the other detector in order to switch between them. Alternatively, the light can be defocused or defracted so as to be incident on all pertinent devices on both (in this case) as required. As should be apparent however, if redundant detectors are used and no light redirection is provided the system must be capable of accepting the losses due to such defocusing or defracting because the amount of incident light will be reduced exponentially as it is defocused to a larger and larger area to accommodate a larger number of redundant devices or a large pitch among them.

Figure 10:
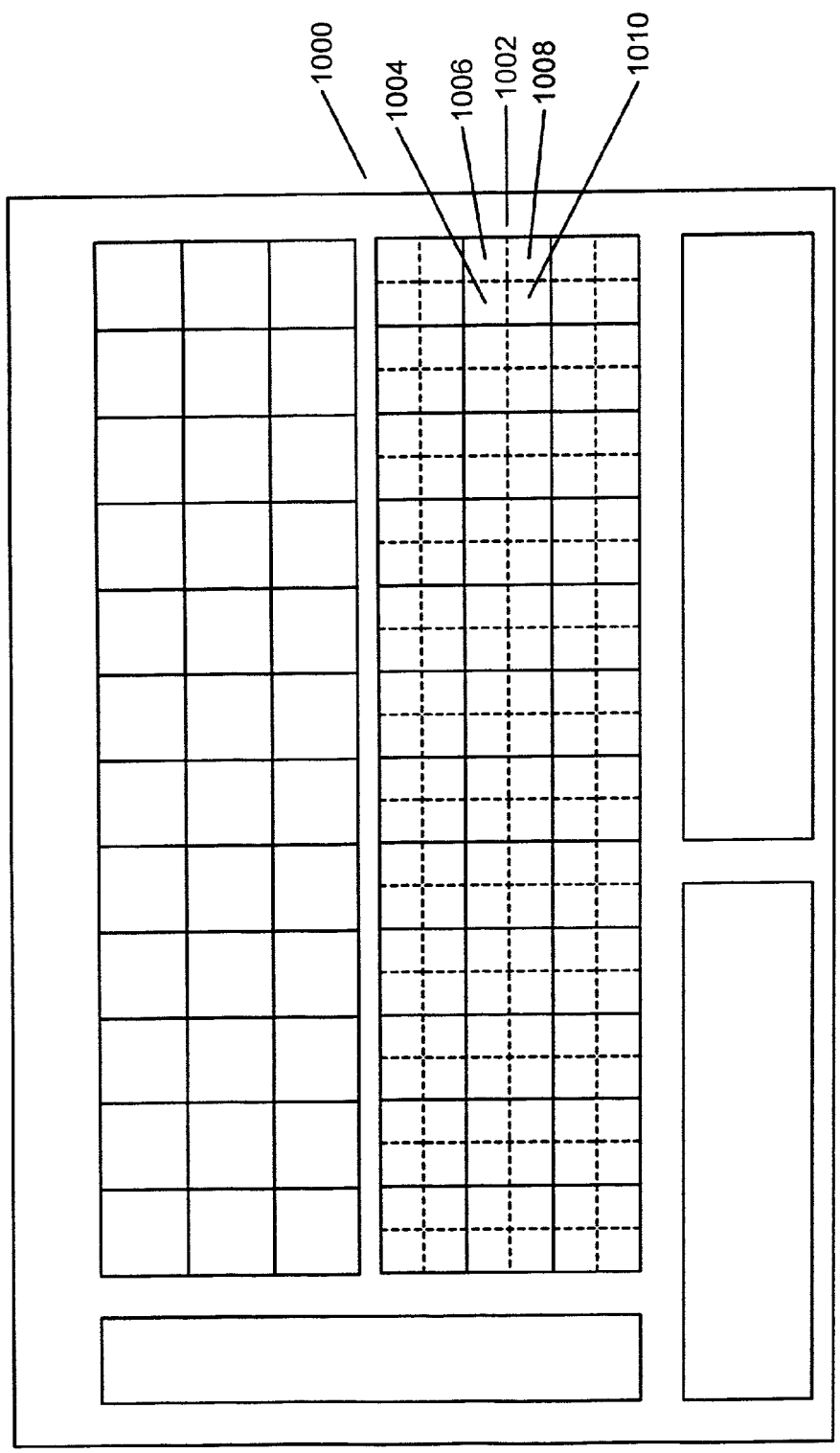
FIG. 10 shows a device of FIG. 5 employing groups of four redundant photo detectors according to the invention.

FIG. 10 shows a chip 1000 having an array 1002 similar to the array of FIG. 9 except that the array of FIG. 10 incorporates four redundant detectors 1004, 1006, 1008, 1010 per group.

Having shown a number of functional variants according to the invention, some examples of aspects usable for specific implementations will now be provided.

FIG. 11A shows one functional example of a circuitry arrangement for selecting from among two or more redundant devices according to the invention. In variants according to this example, a common data signal source 1102 is connected to all of the lasers 1104 in a group. As shown two or more lasers are in the group. A multiplexor 1106 (for 1-to-1 connections) or a selector (for 1-to-1 or more connections) is inserted between the power source 1108 for the lasers and the lasers themselves. The control information (whether bit based or bias/modulation based) is used by the control portion 1110 to select which laser receives power. Alternatively, in some variants, the multiplexor can be replaced with a selector that can select any one or more of the lasers.

FIG. 11B shows another functional example of a circuitry arrangement from among two or more redundant devices according to the invention. In variants according to this example, a signal source 1112 is amplified by an amplifier 1114 and connected to the lasers 1106 via a multiplexor (for 1-to-1 connections) or a selector (for 1-to-1 or more connections). The multiplexor 1106 or selector is controlled in a similar manner to FIG. 11A.

Figure 12:
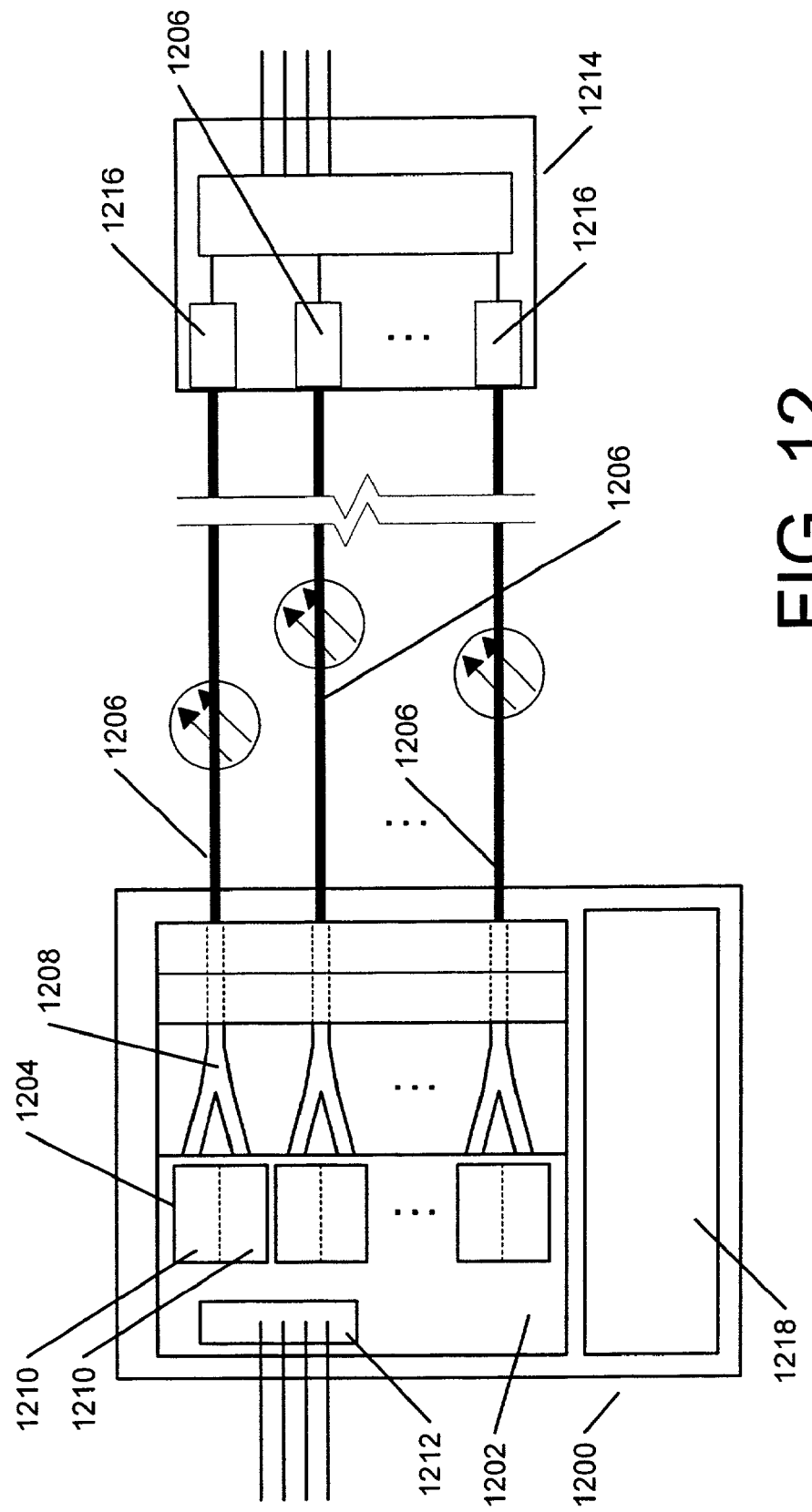
FIG. 12 functionally shows an opto-electronic transceiver incorporating the invention.

FIG. 12 functionally shows a communication system including an opto-electronic transceiver 1200 incorporating the invention. As shown, the transceiver 1200 includes a chip 1202 incorporating redundant lasers 1204 in accordance with the invention. The transceiver 1200 is arranged so that each pair of lasers 1204 is coupled to a common fiber 1206. As shown, optical waveguides 1208 shaped like a "Y", are used to guide laser light from either laser 1210 in the pair to a common fiber 1206. In other variants, other forms of waveguides, or microlenses, gratings, fused fibers, etc., are used to couple the two or more lasers to a common fiber, the particular coupling method used being irrelevant to understanding the invention.

The transceiver 1200 also includes an electronic interface 1212 through which electrical signals, for example digital data can be received and sent. Depending upon the particular set up, the transceiver 1200 may be constructed to convert received digital signals into optical signals to be transmitted over one or more fibers using the lasers, to a receiver 1214, which may be a standalone unit or be part of another transceiver, having photodetectors 1216. Additionally or alternatively, the transceiver 1200 may use those digital signals as control signals and/or receive the signals for use as in any conventional electro-optical transceiver. Similarly, the transceiver 1200 is constructed to detect incident light received on its detectors 1218 and convert that light to digital signals that are then output via the electronic interface in a conventional manner.

Figure 13:
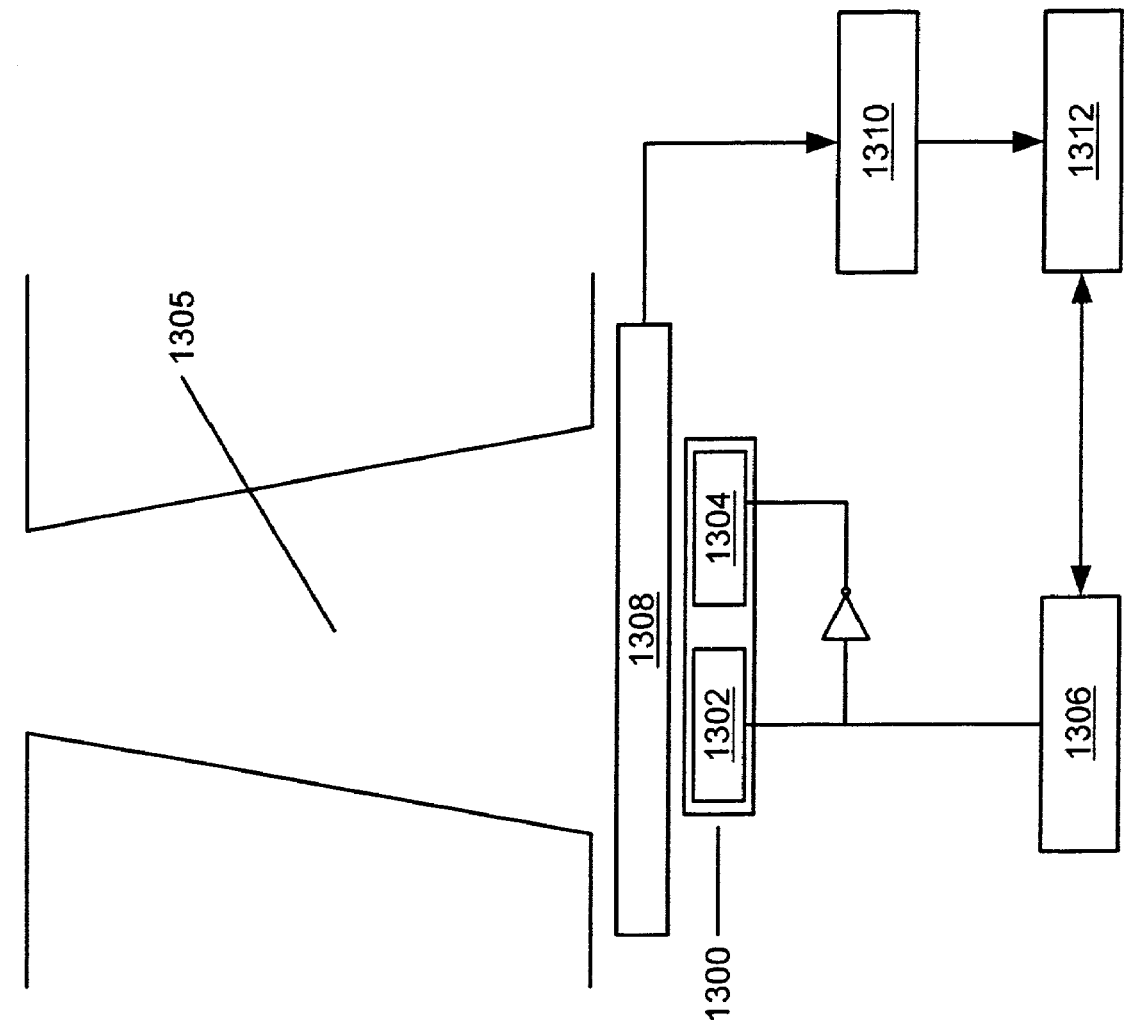
FIG. 13 is a functional block diagram of example automatic failover circuitry for a group of two devices.

Advantageously, further variants can be constructed for automatic failover. FIG. 13 is a functional block diagram of one example way to integrate automatic failover. As shown, a group 1300 is made up of two lasers 1302, 1304 coupled to a common fiber, for example, a "cone" or "funnel" shaped waveguide 1305, that is common to both lasers 1302, 1304. The controller 1306 selects which laser is active by outputting a logical one or zero. A sensor 1308 monitors the output of the active laser, for example via sampling the output power of the laser when in use, and feeds the result back to a failover controller 1310, which may or may not be part of the controller 1306 but is functionally shown separately for purposes of understanding. The failover controller 1310 is used to determine if the active laser should be switched out in favor of another laser in the group based upon some value related to the performance of the laser—in this case output power. Depending upon the particular implementation, any of the many different known techniques for determining if a value is at a limit or within a range can be used. For example, a comparator may be used to directly or logically compare the sample to a threshold value, a trigger can be set to fire when the sample falls below a threshold, etc. . . .

If, at some point, the laser power falls below the specified limit or goes outside the desired range, that laser will be deactivated in favor of another laser in the group using one of the techniques noted above. For example, as shown, the failover controller 1310 is connected to the storage 1312 so that if a failover for a laser is required, the failover controller 1310 changes the value in the storage 1312. That causes the controller 1306 to de-activate the one laser 1302 in favor of the backup laser 1304.

Depending upon the particular implementation, it may be desirable include circuitry or stored information such that, if a substitution of one device for another has occurred (whether automatically or manually) the "bad" device can be designated as such to prevent a switch back to the bad device if the backup device fails.

It should be understood that, although described largely in connection with an optical transceiver, the invention may be straightforwardly employed in an optical transmitter module or an optical receiver module, there being no need for any particular implementation to have two different types of devices (i.e. transmitters and receivers) to be present in the same unit to use the invention.

Moreover, it should be understood that the invention may be straightforwardly employed with any type of laser device, i.e. surface emitting lasers, distributed feedback (DFB) lasers, Distributed Bragg Reflector (DBR) lasers and/or any type of photodetectors.

Thus, while we have shown and described various examples employing the invention, it should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments or other combinations of described portions may be available, is not to be considered a disclaimer of those alternate embodiments. It can be appreciated that many of those undescribed embodiments are within the literal scope of the following claims, and others are equivalent.

What is claimed is:

1. An optical module, comprising:
   a plurality of groups of optical devices, wherein at least one of the plurality of groups comprises at least two optical devices, wherein the at least two optical devices in a group are of a common device type formed on a first side of a common substrate sharing a common data signal contact, wherein the group is separated from other groups by at least one grouping trench that extends completely through the common substrate; and
   a controller coupled to the at least two optical devices and configured to select one of the at least two optical devices in the group to be active at a given time to optically couple with an optical fiber.

2. The optical module of claim wherein the at least two optical devices in the group are lasers.

3. The optical module of claim 2, wherein the lasers comprise top-emitting lasers.

4. The optical module of claim 2, wherein the lasers comprise bottom-emitting lasers.

5. The optical module of claim 2, wherein the lasers comprise, distributed Bragg reflector lasers or distributed feedback lasers.

6. The optical module of claim 1, wherein the at least two optical devices in the group comprise photodetectors.

7. The optical module of claim 6, wherein the photodetectors comprise top-receiving photodetectors.

8. The optical module of claim 6, wherein the photodetectors comprise bottom-receiving, photodetectors.

9. The optical module of claim 1, wherein the plurality of groups optical devices comprise lasers and photodetectors.

10. The optical module of claim 1, further comprising memory configured to store activation information for the at least two optical devices in the group.

11. The optical module of claim 1, further comprising redundancy selection circuitry.

12. An optical transceiver, comprising:
    multiple lasers formed on a first side of a common substrate;
    multiple detectors;
    storage;
    a controller coupled to the storage; and
    an interface configured to couple a single optical fiber to at least two of the multiple lasers that are adjacent to each other, or to at least two of the multiple detectors that are adjacent to each other;
    wherein the number of lasers is different from the number of detectors;
    wherein the storage is configured to identify, among a grouped set of redundant optical devices, an optical device that will be an active optical device;
    wherein the grouped set is defined by a grouping trench;
    wherein the grouping trench extends completely through the common substrate;
    wherein the redundant optical devices include the at least two of the multiple lasers or the at least two of the multiple detectors; and
    wherein the redundant optical devices in the grouped set share a common data input and a common electrical contact.

13. An optical transceiver, comprising:
    at least two optical devices of a first type formed adjacent to each other and formed on a common substrate to form a group, wherein the group is configured for coupling to a single optical fiber and is separated from other groups by at least one grouping trench that extends completely through the common substrate; and
    an optical device of a second type different from the first type and configured for coupling to a second optical fiber;
    wherein the at least two optical devices of the first type are related to each other by a common connection such that they can each receive a single source signal and are individually selectable for activation at a given time such that one of the at least two optical devices can be automatically substituted for another of the at least two optical devices if the other of the at least two optical devices is a bad device.

14. The optical transceiver of claim 13, wherein the at least two optical devices of the first type comprise lasers.

15. The optical transceiver of claim 14, wherein the lasers comprise top-emitting lasers.

16. The optical transceiver of claim 14, wherein the lasers comprise bottom-emitting lasers.

17. The optical transceiver of claim 14, wherein the lasers comprise distributed Bragg reflector lasers or distributed feedback lasers.

18. The optical transceiver of claim 13, wherein the at least two optical devices of the first type comprise photodetectors.

19. The optical transceiver of claim 18, wherein the photodetectors comprise top-receiving photodetectors.

20. The optical transceiver of claim 18, wherein the photodetectors comprise bottom-receiving photodetectors.

21. The optical transceiver of claim 13, wherein the at least two optical devices comprise lasers and photodetectors.

22. The optical transceiver of claim 13, further comprising memory configured to store activation information for the at least two optical devices.

23. The optical transceiver of claim 13, further comprising redundancy selection circuitry.

24. An optical chip, comprising a group of optical devices formed on a common substrate and being of a common type, wherein the group is defined by a grouping trench, and is arranged such that adjacent optical devices in the group are configured for coupling to a single common optical fiber, wherein the optical devices are selectable based, upon an active indication such that one of the optical devices in the group will be an active device and another of the optical devices in the group will be a backup device, wherein the grouping trench extends completely through the common substrate, and wherein the active device and the backup device are individually selectable such that, if the active device fails, the active device will be deselected and the backup device will be selected for use in place of the active device.

25. The optical chip of claim 24, further comprising storage configured to store the active indication.

26. The optical chip of claim 24, wherein the group of optical devices comprise lasers or photodetectors.

27. The optical chip of claim 24, further comprising a common electrical connection among all of the optical devices in the group.

28. The optical chip of claim 24, wherein the optical devices within the group are separated by at one separation trench.

29. The optical chip of claim 24, further comprising multiple fusible links, wherein the active device is determined by a state of at least one of the multiple fusible links.

30. A method of creating an optical chip having redundant devices for use in an opto-electronic unit, the method comprising:
growing active portions of multiple optical devices on a wafer using a semiconductor material;
processing the wafer to create complete optical devices;
patterning the semiconductor material to create individual optical devices;
grouping the devices by forming grouping trenches completely through the common substrate around sets of at least two of the individual devices of a common type and extending the grouping trenches into the common substrate; and
connecting each of the at least two devices to a control circuit such that common data can be received by any of the at least two devices in a set from a single optical fiber but the common data will only be handled by one of the at least two devices in the set that is an active device.

31. The method of claim 30, further comprising:
identifying the active device from the at least two devices in the set; and
storing data for identifying the active device.

32. An optical transceiver comprising:
first number of detectors;
a second number of semiconductor laser transmitters formed on a first side of a common substrate and organized as a group defined by a grouping trench, wherein at least some of the laser transmitters in the group are redundant for others, and wherein the grouping trench extends from the first side of the common substrate through the common substrate to a second side of the common substrate opposite the first side of the common substrate; and
a controller configured to control which of the laser transmitters are active and which of the laser transmitters are redundant.

33. The optical transceiver of claim 32, wherein the first number is at least twice the second number.

34. The optical transceiver of claim 32, wherein the first number equals the second number.

35. The optical transceiver of claim 32, wherein the first number is three times the second number.

36. The optical transceiver of claim 32, wherein the first number is four times the second number.

37. The optical transceiver of claim 32, wherein the laser transmitters are organized as at least two groups.

38. The optical transceiver of claim 37, wherein one of the at least two groups comprises two lasers.

39. The optical transceiver of claim 37, wherein one of the at least two groups comprises three lasers, and wherein at least one of the three lasers is redundant.

40. The optical transceiver of claim 39, wherein exactly one of the three lasers is redundant.

41. The optical transceiver of claim 39, wherein exactly two of the three lasers are redundant.

42. A communications network, comprising:
a first transmitter comprising a number of usable channels;
a first receiver; and
optical fibers coupling the first transmitter to the first receiver;
wherein the first transmitter further comprises multiple lasers formed, on a first side of a common substrate and organized into a group defined by a grouping trench, wherein the grouping trench extends completely through the common substrate from a second side of the common substrate opposite the first side of the common substrate, wherein at least two of the multiple lasers in the group are configured to couple to one of the optical fibers and are selectable to be active or redundant; and
wherein the multiple lasers are controllable such that, if a specific channel is in use by an active laser and a laser failure occurs for the specific channel, a redundant laser can be substituted for the active laser, and wherein the redundant laser and the active laser are from the same group and, after the substitution, the specific channel is in use by the redundant laser.

43. The communications network of claim 42, wherein the first transmitter further comprises a programmable laser selection control.

44. The communications network of claim 42, wherein the first transmitter further comprises a transmitter failure detection sensor.

45. The communications network of claim 42, further comprising an automatic failover circuit.

46. The optical module of claim 1, wherein the at least two of optical devices in the group are configured to have carrier movement therebetween.

47. The optical module of claim 46, wherein the common substrate is electrically conductive, and wherein the carrier movement is through the electrically conductive common substrate.

48. The optical module of claim 1, wherein the optical devices within one group are separated by at least one separation trench configured to isolate individual device contacts.

49. The optical module of claim 1, wherein the controller is coupled to the optical devices via contact pads.

50. The optical module of claim 49, wherein the controller is disposed on an electronic chip, and wherein the optical devices are flip-chip bonded to the electronic chip.

51. The method of claim 30, wherein connecting each of the at least two devices to a control circuit comprises flip-chip bonding the at least two devices to an electronic chip containing the control circuit.

* * * * *